United States Patent

Hatakeyama et al.

Patent Number: 6,117,621
Date of Patent: Sep. 12, 2000

[54] PATTERNING METHOD

[75] Inventors: Jun Hatakeyama; Shigehiro Nagura, both of Nakakubiki-gun, Japan

[73] Assignee: Shin-Etsu Chemical Co., Ltd., Japan

[21] Appl. No.: 09/048,022

[22] Filed: Mar. 26, 1998

[30] Foreign Application Priority Data

Mar. 28, 1997 [JP] Japan ..................... 9-095103

[51] Int. Cl.$^7$ ............... G03F 7/30; G03F 7/004
[52] U.S. Cl. .............. 430/326; 430/270.1; 430/905; 430/910
[58] Field of Search .................. 430/326, 905, 430/910, 270.1

[56] References Cited

U.S. PATENT DOCUMENTS

| | | | |
|---|---|---|---|
| 5,558,976 | 9/1996 | Urano | 430/326 |
| 5,876,900 | 3/1999 | Watanabe | 430/288.1 |
| 5,882,844 | 3/1999 | Tsuchiya | 430/288.1 |

*Primary Examiner*—Kathleen Duda
*Assistant Examiner*—Nicole Barreca
*Attorney, Agent, or Firm*—Millen, White, Zelano & Branigan, P.C.

[57] ABSTRACT

A method for patterning a chemically amplified positive resist material comprising a base polymer having acid labile groups which are eliminated by acid, a photoacid generator and an organic solvent, in which the resist material is applied onto a substrate to a uniform thickness so as to form a resist film that is subsequently exposed, baked, then developed with a developer to form a positive pattern is characterized by using as the base polymer a mixture of at least two base polymers having mutually differing acid labile groups or a base polymer having at least two mutually differing acid labile groups on the same molecule and adjusting the types of the mutually differing acid labile groups and their contents within the base polymer such that, when the chemically amplified positive resist material is applied onto a substrate to a uniform thickness so as to form a resist film that is subsequently exposed, baked, then dissolved with a developer, the exposure E1 which results in an average dissolution rate of 100 Å/s for 500 Å from the surface of the resist film toward the substrate and the exposure E2 which results in an average dissolution rate of 100 Å/s for 1000 Å from the surface of the substrate toward the resist film surface satisfy the relationship: $-0.2<(E2-E1)/E2<0.2$.

17 Claims, 1 Drawing Sheet

PATTERNING METHOD

BACKGROUND OF THE INVENTION

The present invention relates to a method for patterning a chemically amplified positive resist material which provides novel solubility characteristics suitable for microfabrication.

Deep-ultraviolet lithography, one of a number of efforts currently being made to achieve a finer pattern rule in the drive for higher integration and operating speeds in LSI devices, is thought to hold particular promise as the next generation in microfabrication technology. Deep-UV lithography is capable of pattern generation to dimensions of 0.25 μm or less and, when a resist material having low light absorption is used, can form patterns with sidewalls that are nearly vertical to the substrate. One technology that has attracted a good deal of attention recently utilizes a high-intensity KrF excimer laser as the deep-UV light source. Resist materials with low light absorption and high sensitivity are needed to successfully apply this technology to large-volume production.

In light of this, recently developed acid-catalyzed chemically amplified positive resist materials (e.g., JP-B 27660/1990 and JP-A 27829/1988), with their high sensitivity, high resolution and good dry-etching resistance, have excellent properties which make them especially promising as resist materials for deep-UV lithography.

The strong influence of solubility characteristics on the resolution of resist materials has been a subject of debate since the days of novolak-based resist materials. In particular, it is generally well-known that the resolution becomes higher as the tan θ (γ value) increases, and it has been reported (T. Ohfuji, K. Yamanaka and M. Sakamoto: *Proceedings of SPIE*, 920, 190 (1988); T. Kokubo: *Tech. Proceedings of SEMI Technol. Symposium*, 86 (1991)) that approaches such as optimizing the structure of novolak resin in order to increase interactions with the resin (M. Hanabata, A. Furuta et al.: *Proceedings of SPIE*, 771, 85 (1987)), designing sensitizers having a large dissolution-inhibiting effect (C. R. Szmanda, A. Zampini, D. C. Madoux et al.: *ibid.*, 1086, 363 (1989)), and providing novolak resins with a "stonewall" structure (M. Hanabata, Y. Uetani et al.: *ibid.*, 920, 349 (1988)) have the effect of altering the dissolution rate with respect to exposure from a monotonically increasing relationship to a sigmoid relationship, enhancing tan θ and improving the resolution.

However, we found through investigations that, particularly in the case of chemically amplified positive resist materials, merely increasing the slope of dissolution rate versus exposure does not by itself necessarily lead to increases in the resolution and focal depth, and so we set out to resolve this problem.

SUMMARY OF THE INVENTION

An object of the present invention is to provide a method for patterning a chemically amplified positive resist material which offers novel solubility characteristics suitable for microfabrication.

We have conducted extensive investigations in order to achieve this object, as a result of which we have discovered that increases in resolution and focal depth are strongly affected both by an increase in slope as well as by the dissolution rate profile within the resist film, and that this in-film dissolution rate profile has a great influence particularly in the case of chemically amplified positive resist materials.

That is, we have found that when a resist film of a chemically amplified positive resist material is applied onto a substrate and exposed while varying the exposure dose in a stepwise manner, then is baked and developed with a developer, the dissolution rate profile within the film has little influence in unexposed regions where the dissolution rate is low and in overexposed regions where the dissolution rate is high, but it has a strong influence in regions of intermediate exposure where the dissolution rate is 10 to 300 Å/sec and the slope of dissolution rate versus exposure is greatest. More specifically, assume that an exposure E1 results in an average dissolution rate of 100 Å/sec for 500 Å from the surface of the resist film toward the substrate and an exposure E2 results in an average dissolution rate of 100 Å/sec for 1,000 Å from the surface of the substrate toward the resist film surface when the resist film is developed. If there forms a poorly soluble surface stratum, (E2−E1)/E2 becomes a large negative value, and hole patterns and trench patterns end up having too low a resolution and focal depth. On the other hand, if the surface is readily dissolvable, (E2−E1)/E2 becomes a large positive value, the rectangularity of group lines diminishes, and the resolution and focal depth of isolated line patterns decrease. However, we have discovered that when a chemically amplified positive resist material having E1 and E2 falling within the range of $$-0.2 < (E2-E1)/E2 < 0.2$$

is used, the resolution and focal depth increase.

Based on these findings, the present invention provides a method for patterning a chemical amplified positive resist material which is defined below.

(I) A method for patterning a chemically amplified positive resist material comprising a base polymer having acid labile groups which are eliminated by acid, a photoacid generator and an organic solvent, in which the resist material is applied onto a substrate to a uniform thickness so as to form a resist film that is subsequently exposed, baked, then developed with a developer to form a positive pattern, characterized by using as the base polymer a mixture of at least two base polymers having mutually differing acid labile groups or a base polymer having at least two mutually differing acid labile groups on the same molecule and adjusting the types of the mutually differing acid labile groups and their contents within the base polymer such that, when the chemically amplified positive resist material is applied onto a substrate to a uniform thickness so as to form a resist film that is subsequently exposed, baked, then dissolved with a developer, the exposure E1 which results in an average dissolution rate of 100 Å/s for 500 Å from the surface of the resist film toward the substrate and the exposure E2 which results in an average dissolution rate of 100 Å/s for 1000 Å from the surface of the substrate toward the resist film surface satisfy the relationship:

$$-0.2 < (E2-E1)/E2 < 0.2.$$

(II) The patterning method described in I above wherein the base polymer is polyhydroxystyrene or a copolymer of hydroxystyrene with styrene, α-methylstyrene, tert-butyl (meth)acrylate, maleic anhydride or di-tert-butyl maleate, in which some of the hydrogen atoms on the phenolic hydroxyl groups are substituted with acid labile groups.

(III) The patterning method described in 1 or II above wherein the mutually differing acid labile groups are a combination of at least one acid labile group selected from Group 1 below with at least one acid labile group selected from Group 2 below:

Group 1

(1)
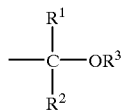

(2)
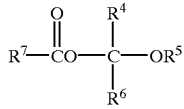

(3)
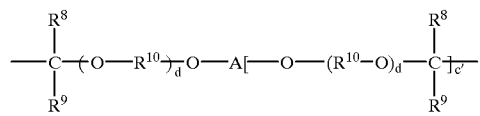

(4)
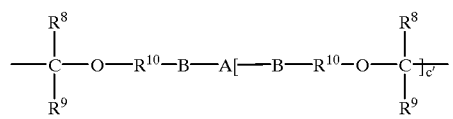

wherein $R^1$ and $R^2$ are hydrogen, methyl or ethyl; $R^3$ is a monovalent hydrocarbon of 1 to 18 carbon atoms which may contain a heteroatom; $R^1$ and $R^2$, $R^1$ and $R^3$ or $R^2$ and $R^3$ may together form a ring, with the proviso that when $R^1$ and $R^2$ form a ring, each is a straight or branched alkylene of 2 or 3 carbon atoms, and when $R^1$ and $R^3$ or $R^2$ and $R^3$ form a ring, each is a straight or branched alkylene of 2 to 18 carbon atoms; $R^4$, $R^5$ and $R^6$ are straight, branched or cyclic alkyl of 1 to 12 carbon atoms; $R^7$ is an alkylene of 1 to 8 carbon atoms; $R^8$ and $R^9$ are hydrogen or straight, branched or cyclic alkyl of 1 to 8 carbon atoms and may together form a ring, with the proviso that when they form a ring, each is a straight or branched alkylene of 1 to 8 carbon atoms; $R^{10}$ is a straight, branched or cyclic alkylene of 1 to 10 carbon atoms; the letter d is 0 or an integer from 1 to 10; A is a c-valent aliphatic or alicyclic saturated hydrocarbon, aromatic hydrocarbon or heterocyclic group having 1 to 50 carbon atoms which may have an intervening heteroatom, and in which some of the hydrogen atoms attached to the carbon atoms may be substituted with hydroxyl, carboxyl, acyl or fluorine; B is —CO—O—, —NHCO—O— or —NHCONH—; the letter c is an integer from 2 to 8; and c' is an integer from 1 to 7;

Group 2

(5)
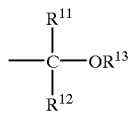

(6)
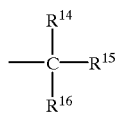

(7)
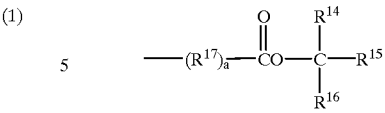

wherein $R^{11}$ and $R^{12}$ are hydrogen or straight, branched or cyclic alkyl of 3 to 12 carbon atoms, with the combined number of carbon atoms in $R^{11}$ and $R^{12}$ being 3 to 12; $R^{13}$ is a monovalent hydrocarbon having 1 to 18 carbon atoms which may contain a heteroatom; $R^{11}$ and $R^{12}$, $R^{11}$ and $R^{13}$, or $R^{12}$ and $R^{13}$ may together form a ring, with the proviso that when $R^{11}$ and $R^{12}$ form a ring, each is a straight or branched alkylene of 4 to 12 carbon atoms, and when $R^{11}$ and $R^{13}$ or $R^{12}$ and $R^{13}$ form a ring, each is a straight or branched alkylene of 4 to 18 carbon atoms; $R^{14}$, $R^{15}$ and $R^{16}$ are straight, branched or cyclic alkyl of 1 to 12 carbon atoms; $R^{17}$ is an alkylene of 1 to 8 carbon atoms; and the letter a is 0 or 1.

(IV) The patterning method described in I, II, or III above wherein the photoacid generator is at least one selected from among those having the general formula (8):

$$(R^{30})_b M^+ K^- \qquad (8)$$

wherein $R^{30}$ is a straight, branched or cyclic alkyl of 1 to 12 carbon atoms, an aryl of 6 to 12 carbon atoms, or an aralkyl of 7 to 12 carbon atoms, $M^+$ is iodonium or sulfonium, $K^-$ is a non-nucleophilic counter-ion; and the letter b is 2 or 3, those having the general formula (9):

(9)
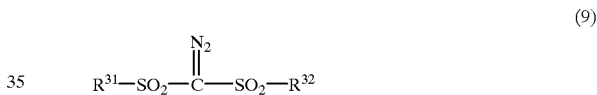

wherein $R^{31}$ and $R^{32}$ are straight, branched or cyclic alkyl or halogenated alkyl of 1 to 12 carbon atoms, aryl or halogenated aryl of 6 to 12 carbon atoms, or aralkyl of 7 to 12 carbon atoms, and those having the general formula (10):

(10)
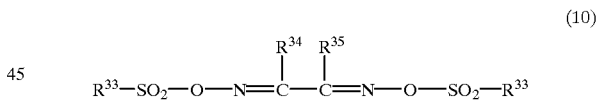

wherein $R^{33}$, $R^{34}$ and $R^{35}$ are straight, branched or cyclic alkyl or halogenated alkyl of 1 to 12 carbon atoms, aryl or halogenated aryl of 6 to 12 carbon atoms, or aralkyl of 7 to 12 carbon atoms, and $R^{34}$ and $R^{35}$, taken together, may form a cyclic structure, with the proviso that when they form a cyclic structure, each is a straight or branched alkylene of 1 to 6 carbon atoms, and the photoacid generator is blended in an amount selected from within a range of 0.2 to 20 parts by weight per 100 parts by weight of the base polymer such as to satisfy the relationship:

$$-0.2 < (E2-E1)/E2 < 0.2.$$

DETAILED DESCRIPTION OF THE INVENTION

Figure 1:
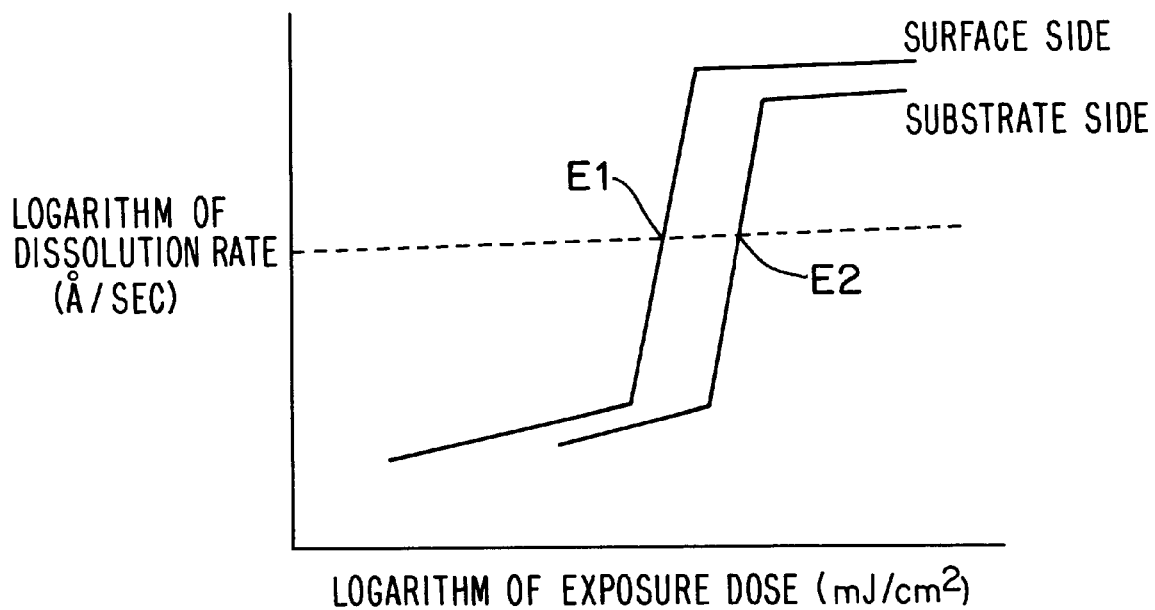
FIG. 1 is a graph of the solubility characteristics for chemically amplified positive resist materials.

The chemically amplified positive resist material in the patterning method of the invention comprises, as the main component, a base polymer that has acid labile groups and that becomes alkali-soluble upon the elimination of these acid labile groups by an acid, to which base polymer are added, as needed, a photoacid generator, a dissolution regulator, a basic compound and the like. These components are generally dissolved in an organic solvent to form a composition ready for use. In the present invention, there is employed a resist material which, when formed on a substrate as a resist film that is subsequently exposed, baked, then developed with a developer, has solubility characteristics for the developer (shown in FIG. 1) such that the exposure E1 which results in an average dissolution rate of 100 Å/sec for 500 Å from the surface of the resist film toward the substrate time and the exposure E2 which results in an average dissolution rate of 100 A/sec for 1,000 Å from the surface of the substrate toward the resist film surface satisfy the relationship:

$$-0.2<(E2-E1)/E2<0.2,$$

and preferably the relationship:

$$-0.15<(E2-E1)/E2<0.15.$$

The value of (E2–E1)/E2 depends primarily upon the types of acid labile groups on the polymer.

The base polymer herein is thus a polymer which has acid labile groups and which becomes alkali-soluble when these acid labile groups are eliminated by acid. Use is generally made of a polyhydroxystyrene polymer or a copolymer of hydroxystyrene and a monomer copolymerizable therewith, in which polymer or copolymer the hydrogen atoms on the phenolic hydroxyl groups, and in some cases on alcoholic hydroxyl groups and carboxyl groups as well, are partially substituted with acid labile groups. Examples include copolymers of hydroxystyrene and styrene, copolymers of hydroxystyrene and α-methylstyrene, copolymers of hydroxystyrene and tert-butyl acrylate, copolymers of hydroxystyrene and tert-butyl methacrylate, copolymers of hydroxystyrene and maleic anhydride, and copolymers of hydroxystyrene and di-tert-butyl maleate. The value of (E2–E1)/E2 above is determined by the type of acid labile group; that is, in the case of polyhydroxystyrene, for example, by the type of R (acid labile group) in the following formula. In the above-mentioned copolymers, the content of hydroxystyrene units is preferably 10 to 98 mol %, and especially 20 to 95 mol %.

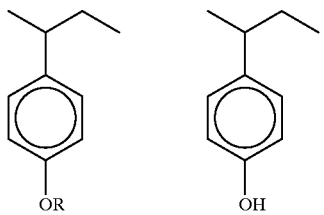

The acid labile group R is not limited to monovalent groups, and may be a group having a valence of 2 or more. If R is a group having a valence of 2 or more, it may function as an intermolecular or intramolecular crosslinking group. For example, when R is divalent, it may crosslink in the manner shown below.

Examples of acid labile groups which make (E2–E1)/E2 positive (Group 1) and acid labile groups which make this negative (Group 2) are given below.

Group 1: Acid Labile Groups Which Make (E2–E1)/E2 Positive (Resist Film Surface Dissolves Easily)

Examples of acid labile groups that make (E2–E1)/E2 positive include the groups having general formulas (1) to (4) below.

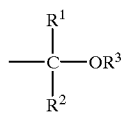

(1)

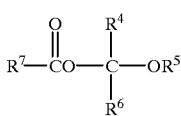

(2)

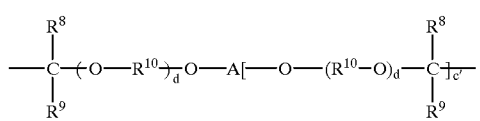

(3)

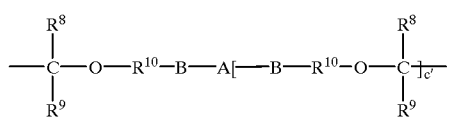

(4)

In the formulas, $R^1$ and $R^2$ are hydrogen, methyl or ethyl; $R^3$ is a monovalent hydrocarbon with 1 to 18 carbon atoms which may contain a heteroatom; $R^1$ and $R^2$, $R^1$ and $R^3$ or $R^2$ and $R^3$ may together form a ring, with the proviso that when $R^1$ and $R^2$ form a ring, each is a straight or branched alkylene of 2 or 3 carbon atoms, and when $R^1$ and $R^3$ or $R^2$ and $R^3$ form a ring, each is a straight or branched alkylene of 2 to 18 carbon atoms; $R^4$, $R^5$ and $R^6$ are straight, branched or cyclic alkyl of 1 to 12 carbon atoms; $R^7$ is an alkylene of 1 to 8 carbon atoms; $R^8$ and $R^9$ are hydrogen or straight, branched or cyclic alkyl of 1 to 8 carbon atoms and may together form a ring, with the proviso that when they form a ring, each is a straight or branched alkylene of 1 to 8 carbon atoms; $R^{10}$ is a straight, branched or cyclic alkylene of 1 to 10 carbon atoms; the letter d is 0 or an integer from 1 to 10; A is a c-valent aliphatic or alicyclic saturated hydrocarbon, aromatic hydrocarbon group or heterocyclic group having 1 to 50 carbon atoms which may have an intervening heteroatom, and in which some of the hydrogen atoms attached to the carbon atoms may be substituted with hydroxyl, carboxyl, acyl or fluorine; B is —CO—O—, —NHCO—O— or —NHCONH—; the letter c is an integer from 2 to 8; and c' is an integer from 1 to 7.

More specifically, in formula (1), $R^3$ is a monovalent hydrocarbon group with 1 to 18 carbon atoms, preferably 1 to 12 carbon atoms, and more preferably 1 to 8 carbon atoms, which may have a heteroatom. Examples include straight, branched or cyclic alkyl groups; unsubstituted or substituted aryl groups, such as phenyl, p-methylphenyl, p-ethylphenyl, and alkoxyphenyl groups (e.g., p-methoxyphenyl); aralkyl groups such as benzyl and phenethyl; and modified forms of the above groups, such as alkyl groups which contain an oxygen atom, or in which a hydrogen atom attached to a carbon atom is replaced with a hydroxyl group or two hydrogen atoms are replaced with an oxygen atom to form a carbonyl group, as shown below.

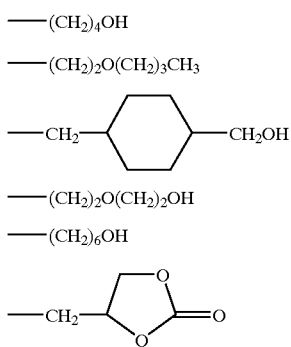

When $R^1$ and $R^2$ together form a ring, $R^1$ and $R^2$ are each straight or branched alkylene groups having 2 or 3 carbon atoms. When $R^3$ forms a ring together with $R^1$ or $R^2$, $R^1$ and $R^3$ or $R^2$ and $R^3$ are each straight or branched alkylene groups having 2 to 18 carbon atoms, preferably 2 to 12 carbon atoms, and more preferably 2 to 8 carbon atoms.

Examples of groups having formula (1) above include the following.

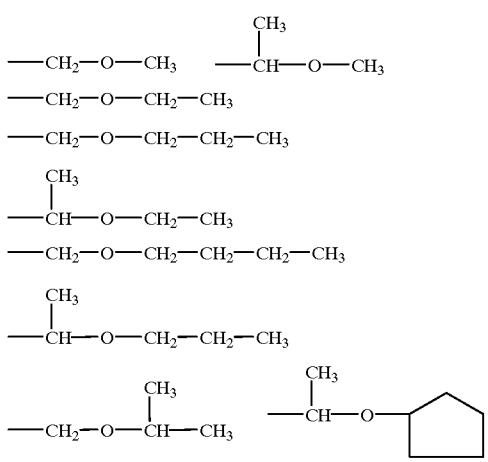

-continued

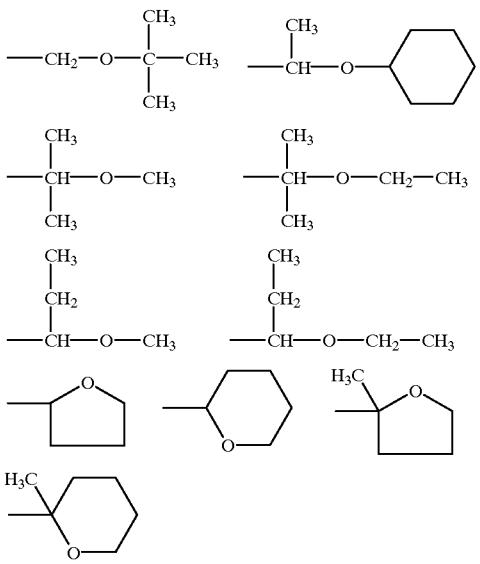

In formula (2), $R^4$, $R^5$ and $R^6$ are each straight, branched or cyclic alkyl groups having 1 to 12 carbon atoms, preferably 1 to 8 carbon atoms, and more preferably 1 to 6 carbon atoms. Examples include methyl, ethyl, n-propyl, isopropyl, n-butyl, isobutyl, tert-butyl, tert-amyl, dimethylmethyl, cyclopropyl, cyclohexyl, and 1-cyclopropyl-1-methylethyl.

$R^7$ is an alkylene group having 1 to 8 carbon atoms, preferably 1 to 6 carbon atoms, and more preferably 1 to 4 carbon atoms. Examples include straight or branched alkylene, such as methylene, ethylene, dimethylethylene, n-propylene, isopropylene, n-butylene, and isobutylene.

Examples of groups having formula (2) include the following.

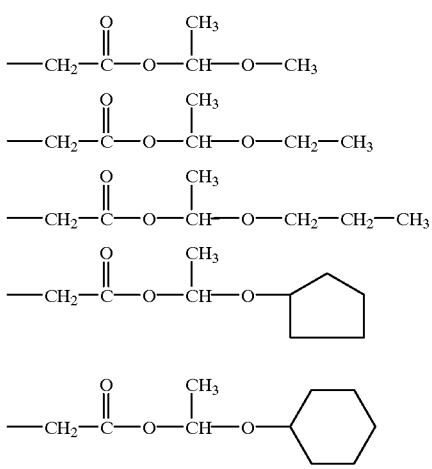

Acid labile groups (acid labile crosslinking groups) having formula (3) and (4) are now described. As is apparent from the value of cl in formulas (3) and (4), these crosslinking groups are not limited to divalent groups, and have a valence of 3 to 8. Formulas (3a) and (4a) below represent some examples of divalent crosslinking groups, and formulas (3b) and (4b) represent some examples of trivalent crosslinking groups.

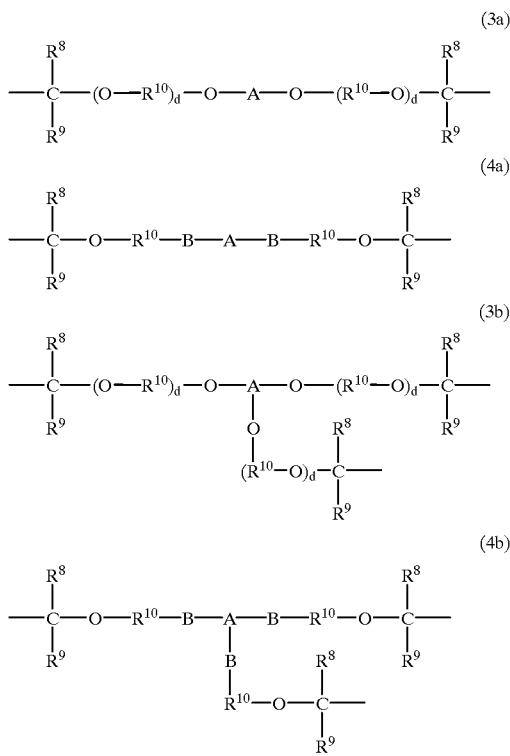

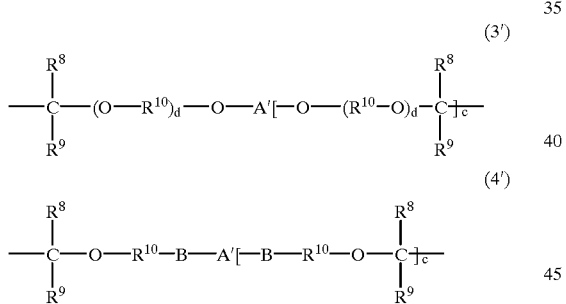

Of the crosslinking groups represented by above formulas (3) and (4), those having formulas (3') and (4') below are especially preferable.

In these formulas, A' is a c"-valent straight, branched or cyclic alkylene, alkyltriyl or alkyltetrayl group having 1 to 20 carbon atoms, or an arylene having 6 to 30 carbon atoms. These groups may have an intervening heteroatom, and some of the hydrogen atoms attached to the carbon atoms thereof may be substituted with hydroxyl groups, carboxyl groups, acyl groups or fluorine atoms. The letter c" is an integer from 2 to 4, and c"' is an integer from 1 to 3. $R^8$, $R^9$, $R^{10}$, B and d are as defined above.

Examples of the straight, branched or cyclic alkyl groups having 1 to 8 carbon atoms represented by $R^8$ and $R^9$ in the above formulas include methyl, ethyl, propyl, isopropyl, n-butyl, isobutyl, tert-butyl, cyclohexyl and cyclopentyl. Examples of the straight, branched or cyclic alkylene group having 1 to 10 carbon atoms represented by $R^{10}$ include ethylene, propylene, isopropylene, n-butylene, isobutylene, cyclohexylene and cyclopentylene.

Examples of the c-valent aliphatic or alicyclic saturated hydrocarbon and aromatic hydrocarbon groups represented by A include unsubstituted or hydroxyl-, carboxyl-, acyl- or fluorine-substituted alkylene groups preferably having 1 to 50 carbon atoms, and especially 1 to 40 carbon atoms, which may have an intervening heteroatom such as O, NH, N(CH$_3$), S or SO$_2$; arylene groups preferably having 6 to 50 carbon atoms, and especially 6 to 40 carbon atoms; combinations of these alkylene groups with these arylene groups; and c"-valent (wherein c" is an integer from 3 to 8) groups obtained by eliminating hydrogen atoms attached to carbon atoms in any of the foregoing groups. Additional examples include c-valent heterocyclic groups, and combinations of these heterocyclic groups with the foregoing hydrocarbon groups.

Illustrative examples of A and A' are given below.

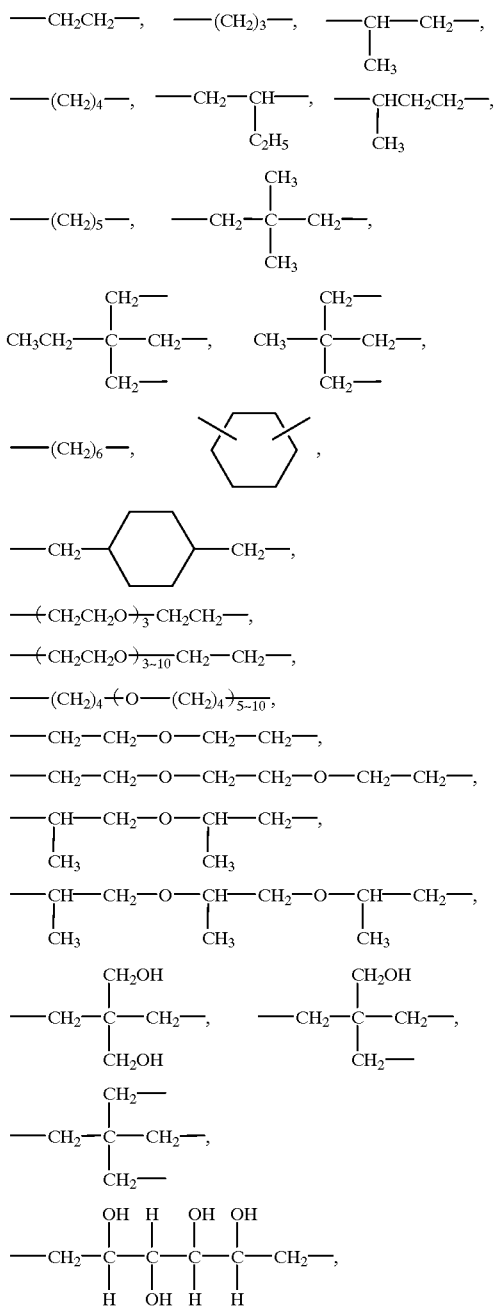

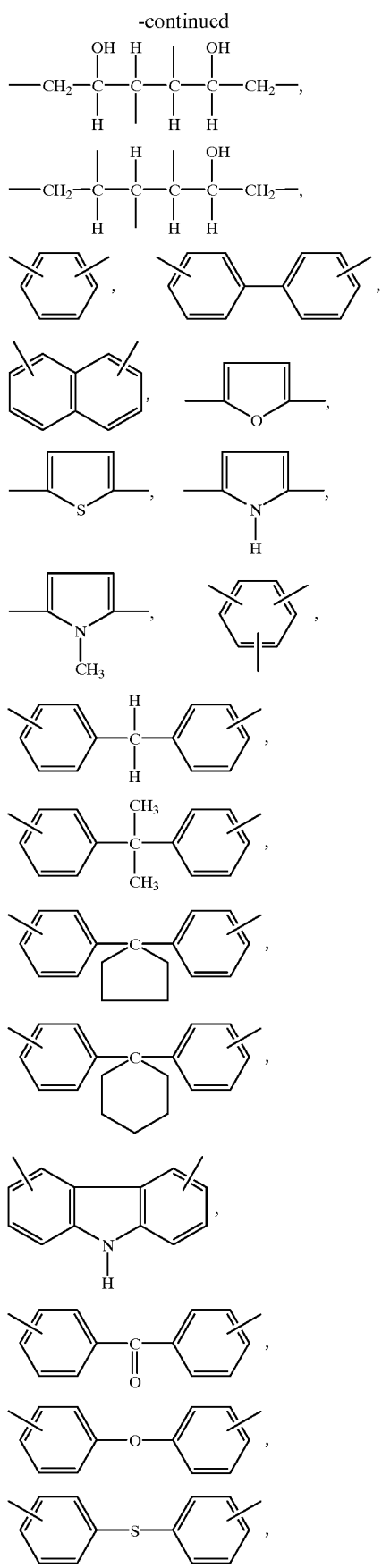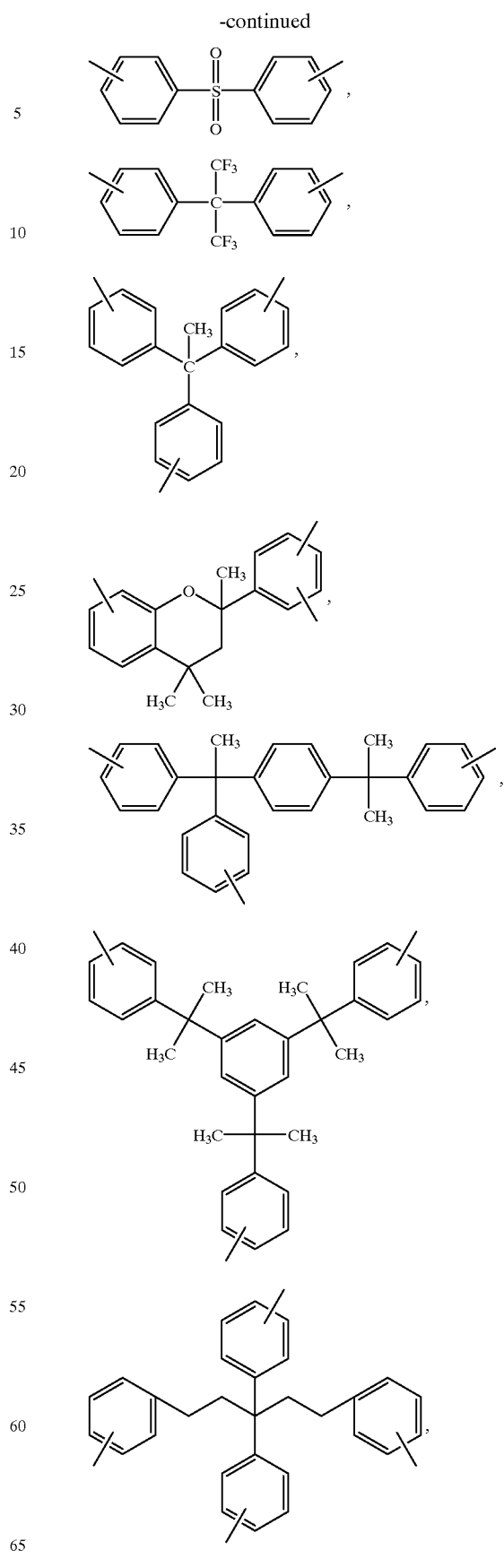

-continued
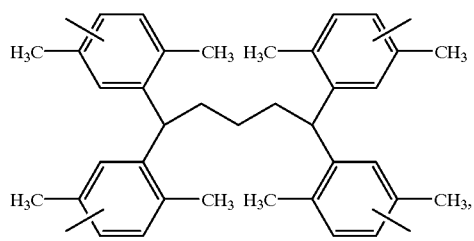
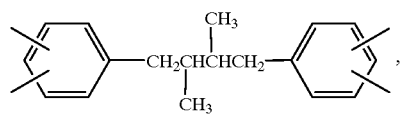
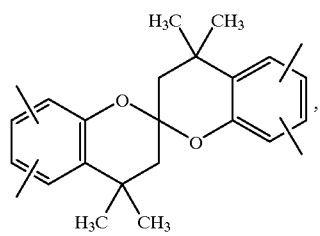
-continued
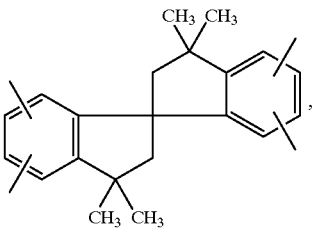
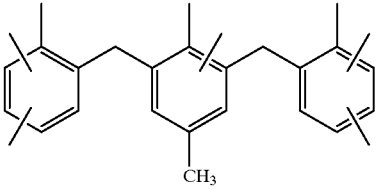
Illustrative examples of groups represented by above formulas (3) and (4) are given below.
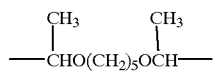
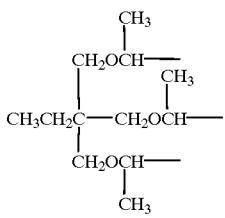
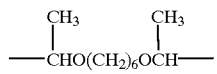
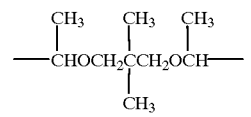
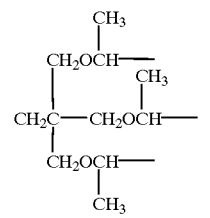
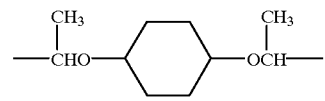
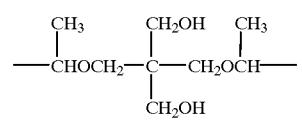

-continued
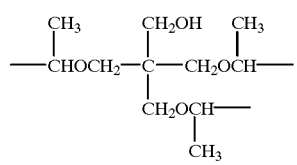
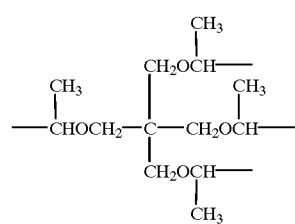
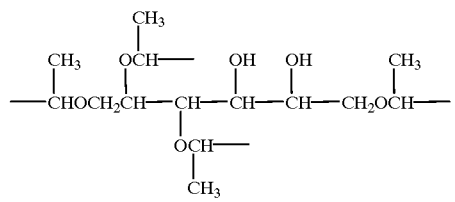
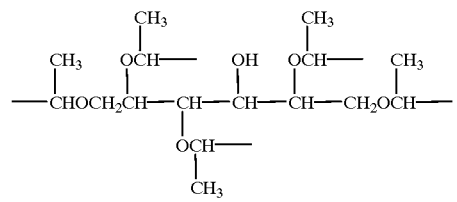
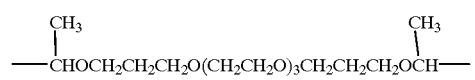
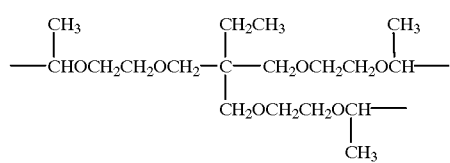
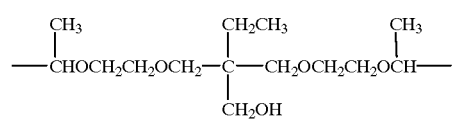
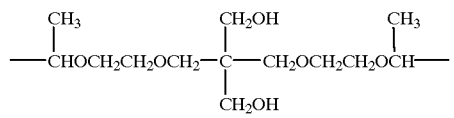
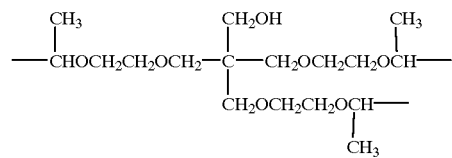
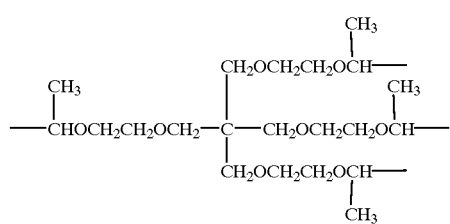
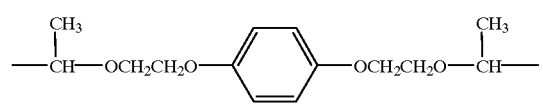
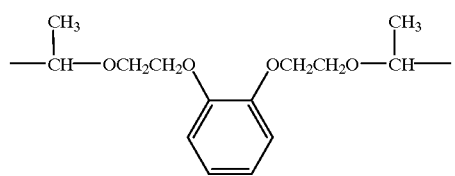
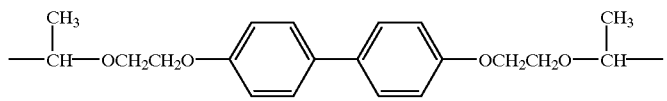
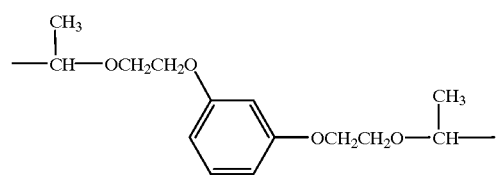
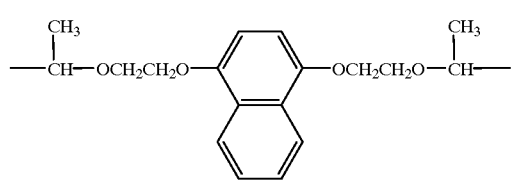
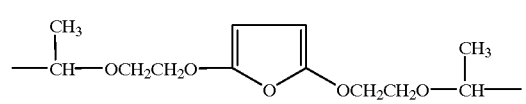

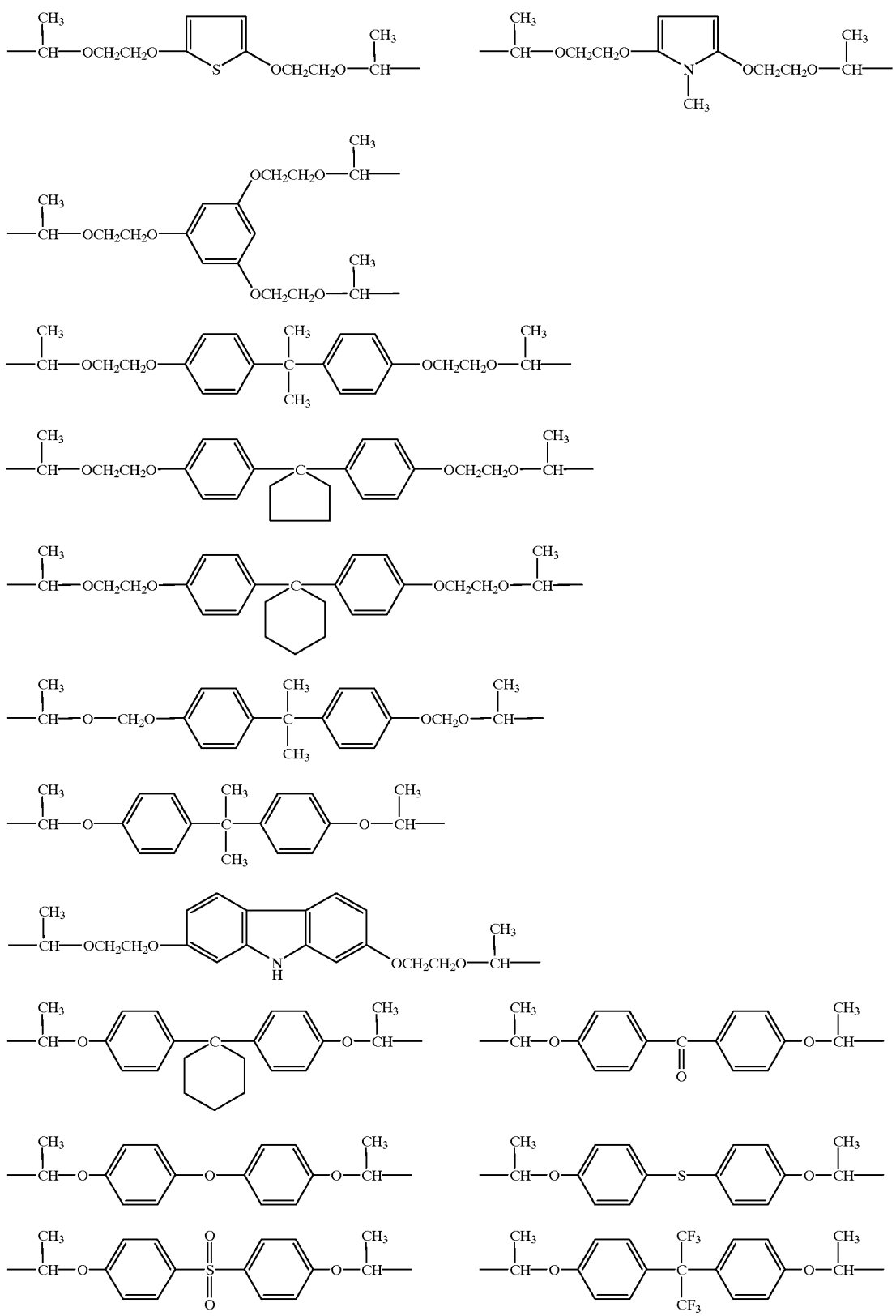

-continued
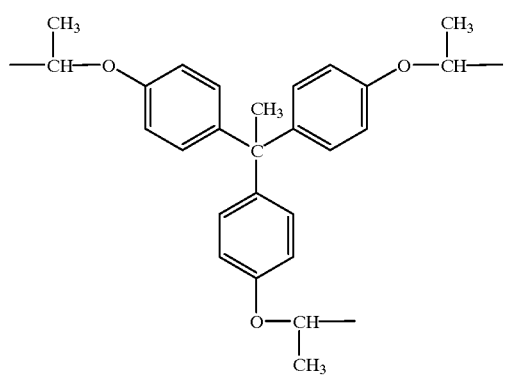
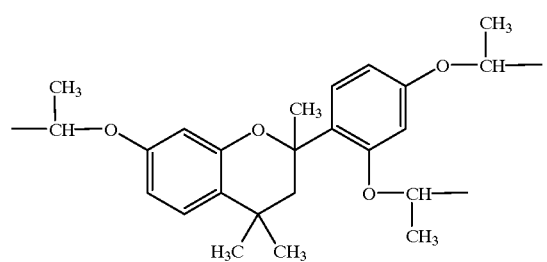
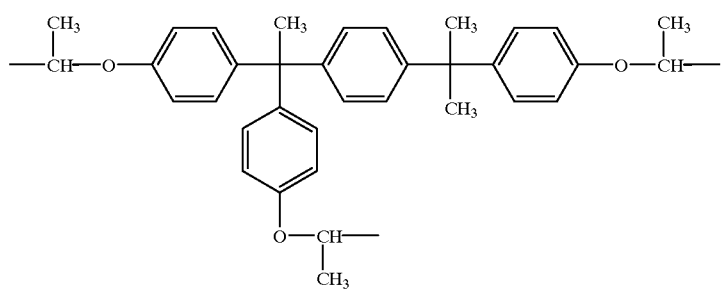
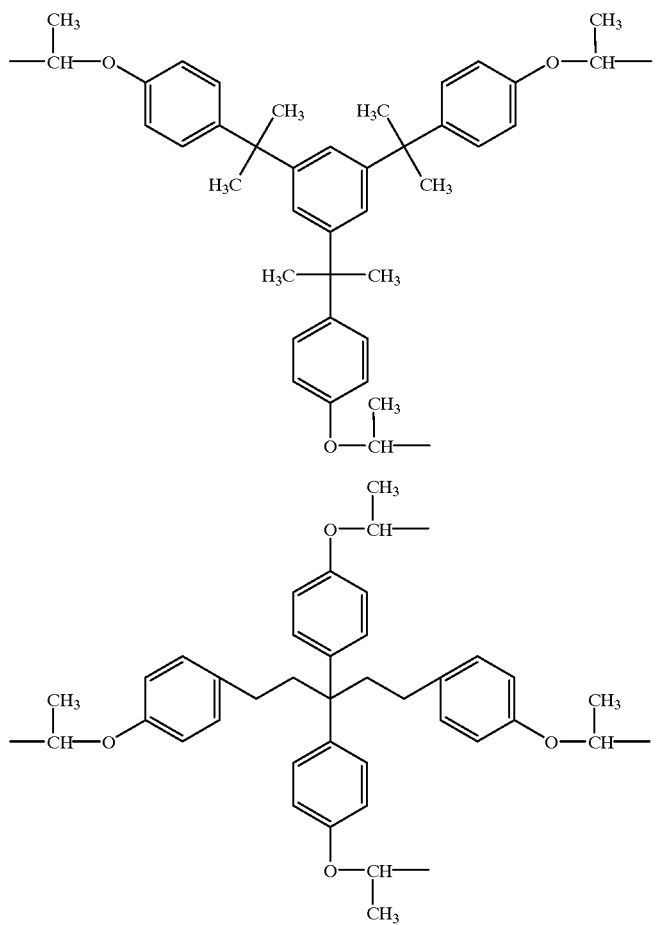

-continued
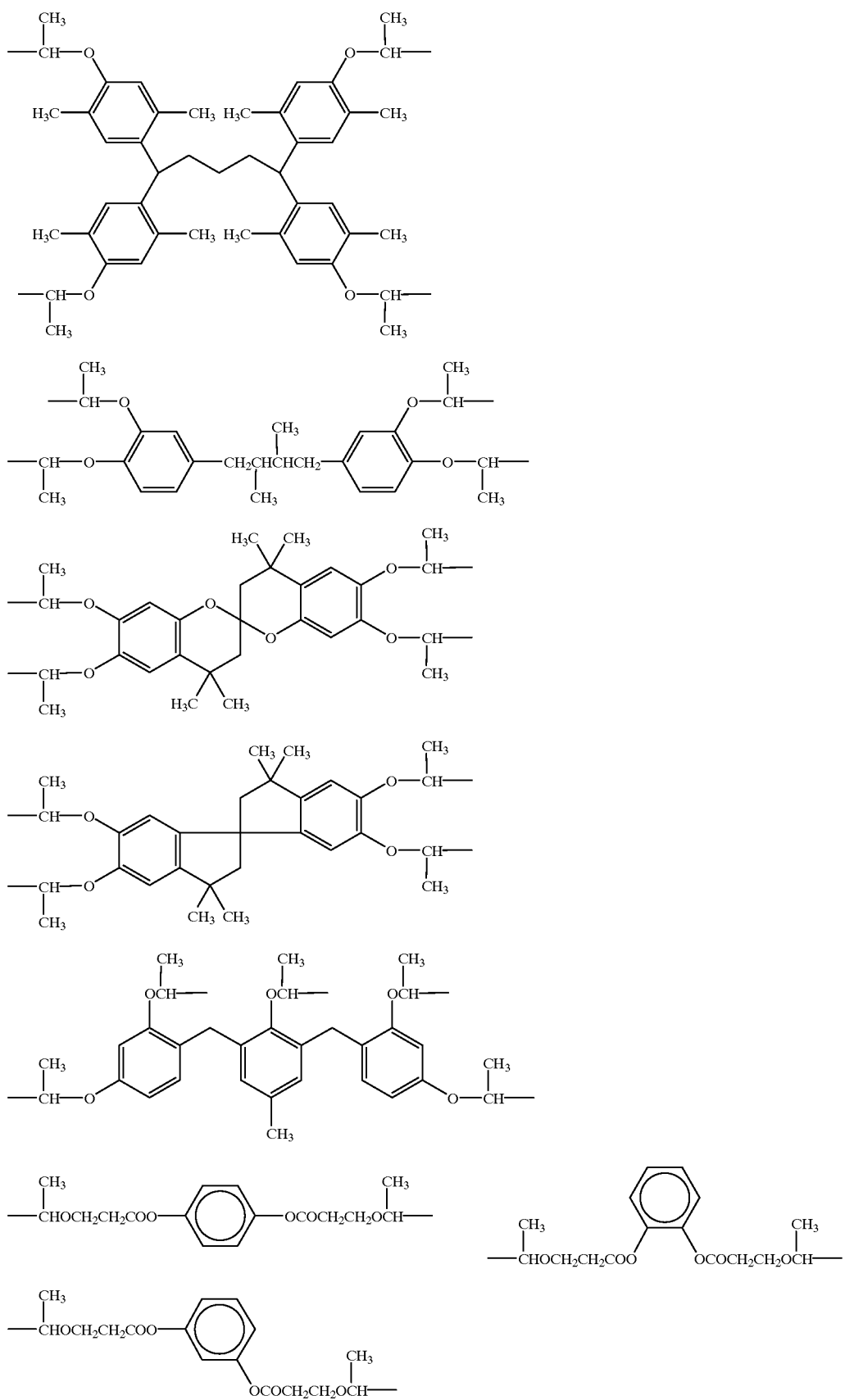

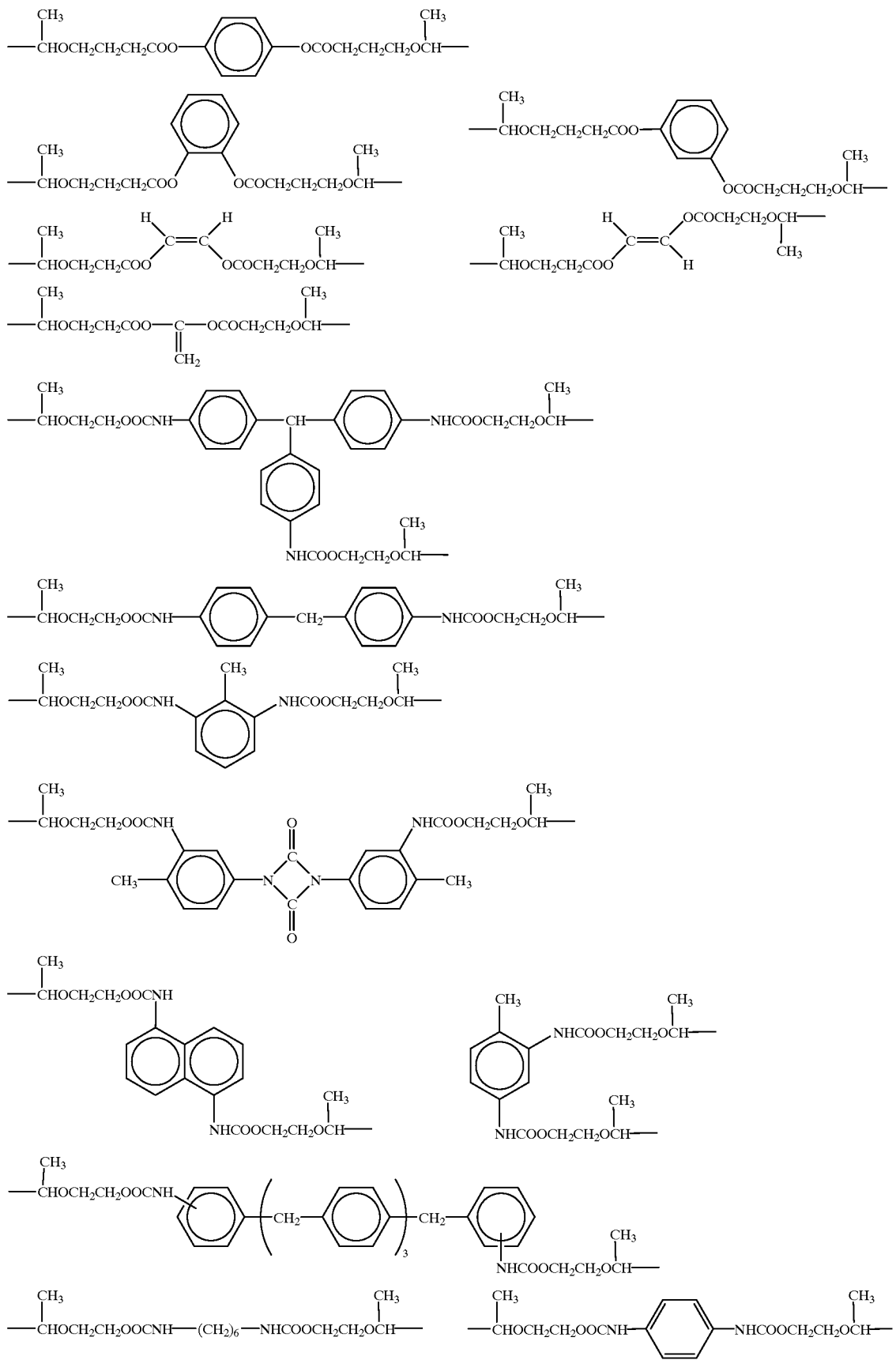

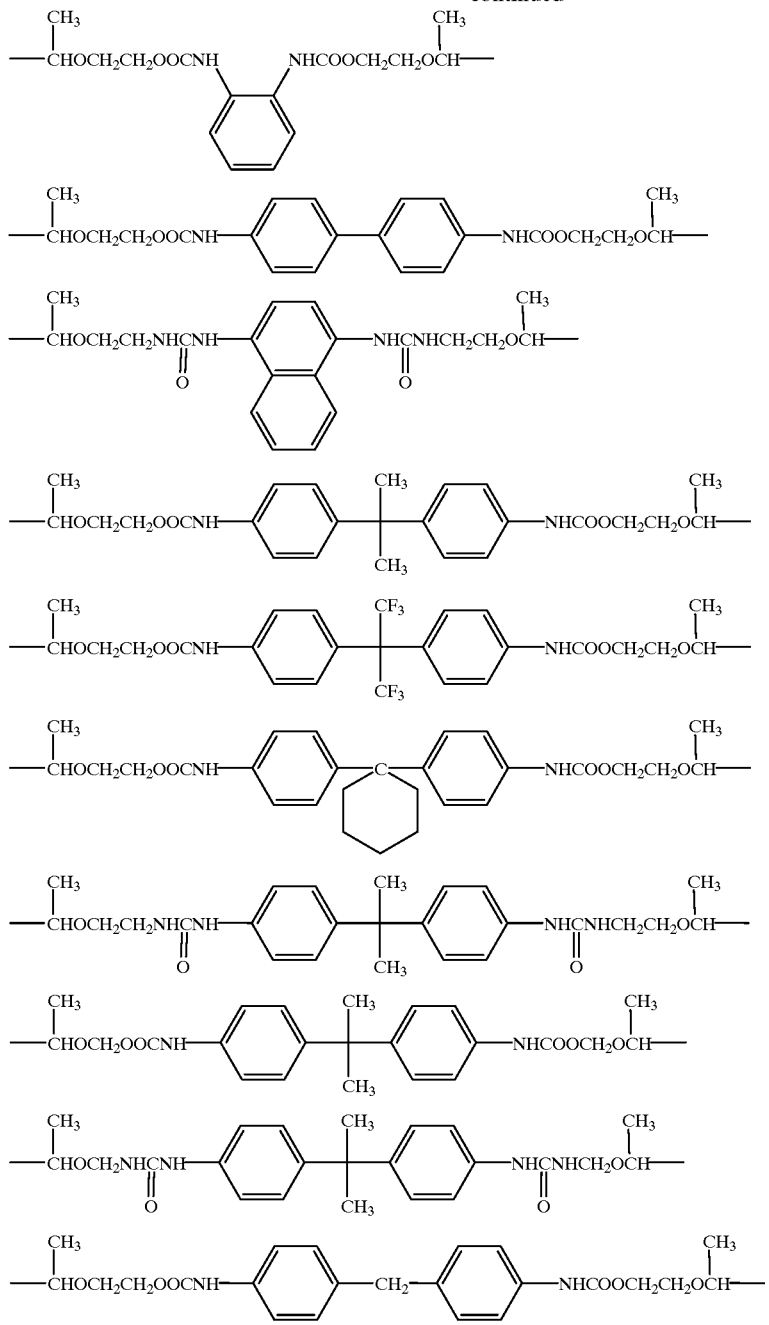
Group 2: Acid Labile Groups Which Make (E2−E1)/E2 Negative (Resist Film Has a Poorly Soluble Surface Stratum)
Examples of acid labile groups which make (E2−E1)/E2 negative include the groups having general formulas (5) to (7) below.
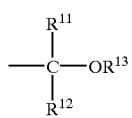 (5)
-continued
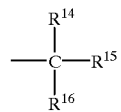 (6)

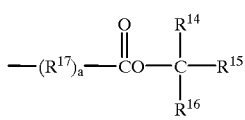 (7)

In the formulas, $R^{11}$ and $R^{12}$ are hydrogen or straight, branched or cyclic alkyl of 3 to 12 carbon atoms, with the combined number of carbon atoms in $R^{11}$ and $R^{12}$ being 3 to 12; $R^{13}$ is a monovalent hydrocarbon of 1 to 18 carbon atoms which may contain a heteroatom; $R^{11}$ and $R^{12}$, $R^{11}$ and $R^{13}$, or $R^{12}$ and $R^{13}$ may together form a ring, with the proviso that when $R^{11}$ and $R^{12}$ form a ring, each is a straight or branched alkylene of 4 to 12 carbon atoms, and when $R^{11}$ and $R^{13}$ or $R^{12}$ and $R^{13}$ form a ring, each is a straight or branched alkylene of 4 to 18 carbon atoms; $R^{14}$, $R^{15}$ and $R^{16}$ are straight, branched or cyclic alkyl of 1 to 12 carbon atoms; $R^{17}$ is an alkylene of 1 to 8 carbon atoms; and the letter a is 0 or 1.

In formula (5), $R^{11}$ and $R^{12}$ are each hydrogen or a straight, branched or cyclic alkyl group having 3 to 12, preferably 3 to 10, and more preferably 3 to 8 carbon atoms. Examples of the groups represented by $R^{11}$ and $R^{12}$ include hydrogen, n-propyl, isopropyl, n-butyl, isobutyl, tert-butyl, tert-amyl, cyclohexyl, and cyclopentyl. The combined number of carbon atoms in $R^{11}$ and $R^{12}$ here is 3 to 12, preferably 3 to 10, and more preferably 3 to 8. $R^{13}$ is a monovalent hydrocarbon having 1 to 18 carbon atoms, preferably 1 to 12 carbon atoms, and more preferably 1 to 8 carbon atoms, which may contain a heteroatom. This has the same definition as $R^3$ described earlier, and the examples of $R^3$ given above apply here as well. When $R^{11}$ and $R^{12}$ together form a ring, each is a straight or branched alkylene group of 4 to 12 carbon atoms, and preferably 4 to 8 carbon atoms. When $R^{11}$ and $R^{12}$ or $R^{12}$ and $R^{13}$ together form a ring, each is a straight or branched alkylene of 4 to 18 carbon atoms, preferably 4 to 12 carbon atoms, and more preferably 4 to 8 carbon atoms. Examples of these alkylene groups include the ones mentioned above.

Examples of groups represented by formula (5) are given below.

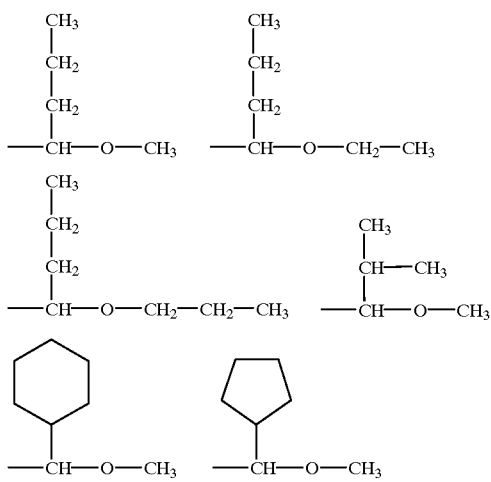

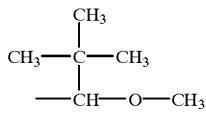

In formulas (6) and (7), $R^{14}$, $R^{15}$ and $R^{16}$ are each a straight, branched or cyclic alkyl group having 1 to 12 carbon atoms, preferably 1 to 8 carbon atoms, and more preferably 1 to 6 carbon atoms. Examples include the same examples as those given earlier for $R^4$, $R^5$ and $R^6$. $R^{17}$ has 1 to 8 carbon atoms, preferably 1 to 6 carbon atoms, and more preferably 1 to 4 carbon atoms, and may be exemplified by the same examples as those given earlier for $R^7$. The letter a is 0 or 1.

Examples of groups represented by formula (6) are given below.

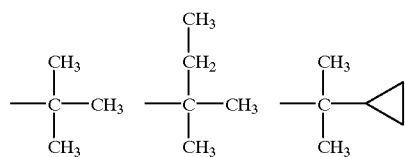

Examples of groups represented by formula (7) are given below.

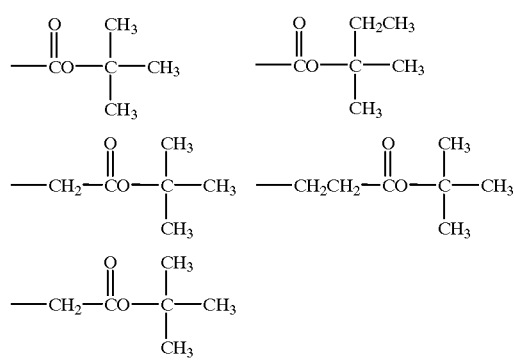

Accordingly, in the invention, the value of (E2–E1)/E2 may be adjusted by, for instance, blending two or more polymers having mutually differing acid labile groups or by using a polymer having two or more mutually differing acid labile groups on the same molecule.

The mutually differing acid labile groups are preferably a combination of at least one acid labile group from above Group 1 with at least one acid labile group from above Group 2. The proportion (S1/S2) of acid labile groups S1 from Group 1 to acid labile groups S2 from Group 2, expressed as a molar ratio, is from 0.01 to 0.99, preferably from 0.02 to 0.98, and more preferably from 0.05 to 0.95.

In the above-described base polymer, no particular limit is imposed on the partial substitution ratio of acid labile groups for hydrogen atoms on the phenolic hydroxyl groups, although preferably more than 0 and up to 80%, more preferably 10 to 50%, and most preferably 15 to 40%, of all hydrogen atoms on the phenolic hydroxyl groups are substituted with acid labile groups.

When polyhydroxystyrene or a copolymer thereof is used as the base polymer, the weight-average molecular weight is preferably within a range of 5,000 to 100,000. The reason is that at a molecular weight of less than 5,000, the film formability and resolution would be unacceptable, and at more than 100,000, the resolution would be poor.

In the resist material used in the patterning method of the invention, the above-described base polymer is included as the main component, and (E2−E1)/E2 is controlled by adjusting the types of acid labile groups and the contents thereof (substitution ratio for hydrogen atoms on phenolic hydroxyl groups) in the base polymer. The resist material also includes a photoacid generator and may include other components as well, such as a dissolution regulator and a basic compound, if necessary. These components are dissolved in an organic solvent to form the resist material. (E2−E1)/E2 is preferably adjusted also by suitably selecting the types and contents of components other than the base polymer.

Examples of the photoacid generator used in the resist material of the patterning method of the invention include onium salts of general formula (8) below, diazomethane derivatives of formula (9), glyoxime derivatives of formula (10), β-ketosulfone derivatives, disulfone derivatives, nitrobenzylsulfonate derivatives, sulfonic acid ester derivatives, and imidoyl sulfonate derivatives.

$$(R^{30})_b M^+ K^- \tag{8}$$

In the formula, $R^{30}$ is a straight, branched or cyclic alkyl group of 1 to 12 carbon atoms, an aryl group of 6 to 12 carbon atoms, or an aralkyl group of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4 -butylphenyl and dimethylphenyl. Exemplary aralkyl groups include benzyl and phenethyl. Examples of the non-nucleophilic counter-ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

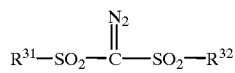

(9)

In the formula, $R^{31}$ and $R^{32}$ are straight, branched or cyclic alkyl or halogenated alkyl groups of 1 to 12 carbon atoms, aryl or halogenated aryl groups of 6 to 12 carbon, or aralkyl groups of 7 to 12 carbon.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

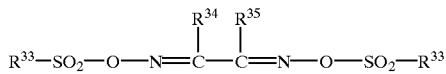

(10)

In the formula, $R^{33}$, $R^{34}$ and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that when they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$ and $R^{35}$ are exemplified by the same groups mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl) phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl) diazomethane, bis(p-toluenesulfonyl)diazomethane, bis(xylenesulfonyl)diazomethane, bis (cyclohexylsulfonyl)diazomethane, bis (cyclopentylsulfonyl)diazomethane, bis(n-butylsulfonyl)diazomethane, bis(isobutylsulfonyl) diazomethane, bis(sec-butylsulfonyl)diazomethane, bis (n-propylsulfonyl)diazomethane, bis (isopropylsulfonyl)diazomethane, bis(tert-butylsulfonyl)diazomethane, bis(n-amylsulfonyl) diazomethane, bis(isoamylsulfonyl)diazomethane, bis (sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl) diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for finer adjustment of the profile.

The photoacid generator is added in an amount of 0.2 to 20 parts (all parts here and below are by weight), and especially 0.5 to 10 parts, per 100 parts of the base polymer. At less than 0.2 part, the amount of acid generated during exposure would be too low and the sensitivity and resolution would be poor, whereas the addition of more than 20 parts would lower the transmittance of the resist and result in poor resolution. When a photoacid generator other than the sulfonium salt of formula (8) above is blended in the resist material, the content of the other photoacid generator is preferably set within a range of 0.2 to 15 parts, and especially 0.5 to 8 parts.

A dissolution regulator may also be added to the resist material in the patterning method of the invention. The dissolution regulator preferably has at least one acid labile group on the molecule. Adding a dissolution regulator enables the contrast to be improved. The dissolution regulator is preferably a compound having an average molecular weight of 100 to 1,000, and especially 150 to 800, and containing on the molecule two or more phenolic hydroxyl groups, in which compound the proportion of the hydrogen atoms on the phenolic hydroxyl groups that are substituted with acid labile groups averages from 0 to 100 mol %.

The proportion of the hydrogen atoms on the phenolic hydroxyl groups that are substituted with acid labile groups is on average at least 0 mol %, and preferably at least 30 mol %, with the upper limit being 100 mol %, and preferably 80 mol %.

These compounds having two or more phenolic hydroxyl groups are preferably compounds of the following formulas (i) to (xi).

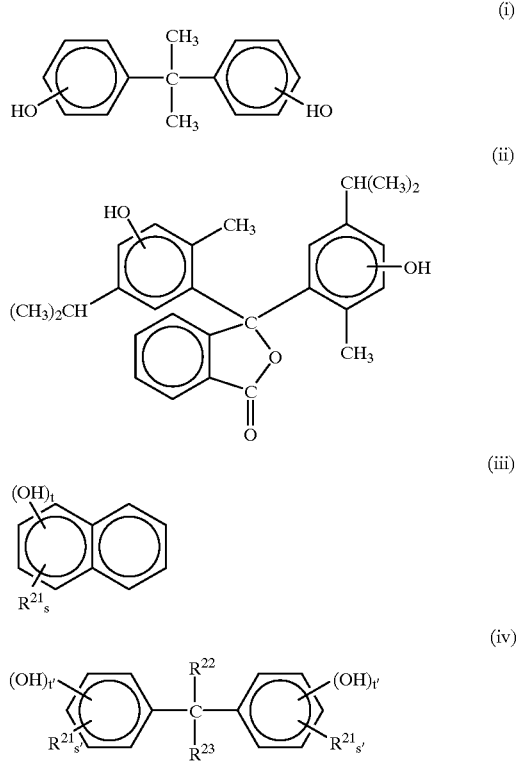

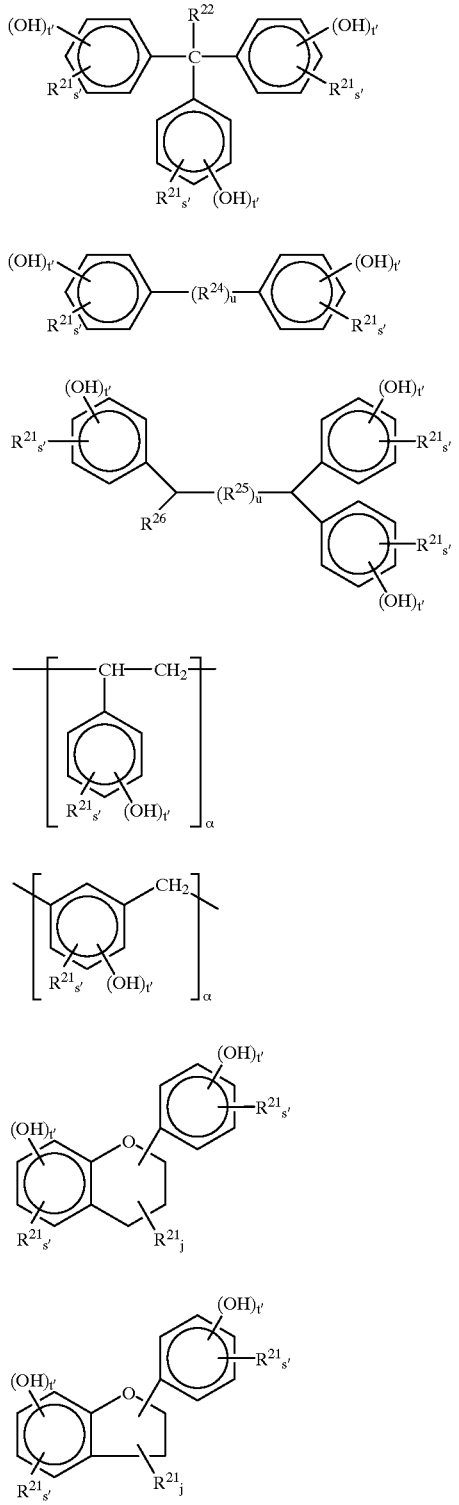

having 1 to 10 carbon atoms, an arylene group having 6 to 10 carbon atoms, carbonyl, sulfonyl, an oxygen atom, or a sulfur atom; $R^{26}$ is hydrogen, a straight or branched alkyl or alkenyl having 1 to 8 carbon atoms, or a hydroxyl-substituted phenyl or naphthyl; and $R^{27}$ is a straight or branched alkylene group having 1 to 10 carbon atoms. The letter j is an integer from 0 to 5; u and h are each 0 or 1; and s, t, s', t', s", and t" are numbers which satisfy respectively s+t=8, s'+t'=5, and s"+t"=4, and are such that at least one hydroxyl group is attached to each phenyl skeleton. The subscript a is a number such as to give the compound of formula (viii) or (ix) a molecular weight of 100 to 1,000.

Exemplary groups represented by $R^{21}$ and $R^{22}$ in the above formulas include hydrogen, methyl, ethyl, butyl, propyl, ethynyl, and cyclohexyl. Exemplary groups represented by $R^{23}$ include the examples just given for $R^{21}$ and $R^{22}$, as well as —COOH and —CH$_2$COOH. Exemplary groups represented by $R^{24}$ include ethylene, phenylene, carbonyl, sulfonyl, and oxygen and sulfur atoms. Exemplary groups represented by $R^{25}$ include methylene and the examples just given for $R^{24}$. Exemplary groups represented by $R^{26}$ include hydrogen, methyl, ethyl, butyl, propyl, ethynyl, cyclohexyl, and hydroxyl-substituted phenyl and naphthyl groups.

Examples of the acid labile group in the dissolution regulator include groups having the following general formulas (11) and (12), tertiary alkyl groups of 4 to 20 carbon atoms, trialkylsilyl groups whose alkyl groups each have 1 to 6 carbon atoms, and oxoalkyl groups of 4 to 20 carbon atoms.

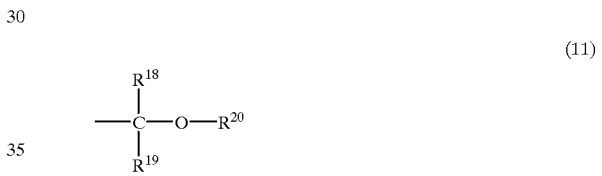 (11)

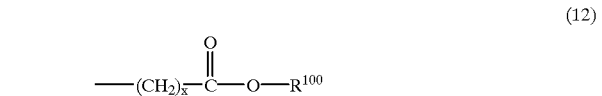 (12)

In the formulas, $R^{18}$ and $R^{19}$ are hydrogen or straight, branched or cyclic alkyls having 1 to 8 carbon atoms, preferably 1 to 6 carbon atoms, and more preferably 1 to 5 carbon atoms; $R^{19}$ is a monovalent hydrocarbon group having 1 to 18 carbon atoms, preferably 1 to 10 carbon atoms, and more preferably 1 to 8 carbon atoms, which may contain a heteroatom such as oxygen; and $R^{18}$ and $R^{19}$, $R^{18}$ and $R^{20}$, or $R^{19}$ and $R^{20}$ may together form a ring with the proviso that when they form a ring, $R^{18}$, $R^{19}$ and $R^{20}$ are each straight or branched alkylene groups having 1 to 18 carbon atoms, preferably 1 to 10 carbon atoms, and more preferably 1 to 8 carbon atoms. Also, $R^{100}$ is a tertiary alkyl group having 4 to 20 carbon atoms, preferably 4 to 15 carbon atoms, and more preferably 4 to 10 carbon atoms; a trialkylsilyl group whose alkyl groups each have 1 to 6 carbon atoms, and preferably 1 to 4 carbon atoms; an oxoalkyl group having 4 to 20 carbon atoms, preferably 4 to 15 carbon atoms, and more preferably 4 to 10 carbon atoms; or a group of the formula —$CR^{18}R^{19}OR^{20}$. The letter x is an integer from 0 to 6.

Exemplary straight, branched or cyclic alkyl groups having 1 to 8 carbon atoms represented by $R^{18}$ and $R^{19}$ include the same groups mentioned earlier.

Exemplary groups represented by $R^{20}$ include straight, branched or cyclic alkyl groups; substituted or unsubstituted aryl groups such as phenyl, p-methylphenyl, p-ethylphenyl, In the formulas, $R^{21}$ and $R^{22}$ are each hydrogen or straight or branched alkyl or alkenyl groups having 1 to 8 carbon atoms; $R^{23}$ is hydrogen, a straight or branched alkyl or alkenyl group having 1 to 8 carbon atoms, or —$(R^{27})_h$—COOH; $R^{24}$ is —$(CH_2)_i$ (wherein i is 2 to 10), an arylene group having 6 to 10 carbon atoms, carbonyl, sulfonyl, an oxygen atom, or a sulfur atom; $R^{25}$ is an alkylene group and alkoxyphenyl groups (e.g., p-methoxyphenyl); aralkyl groups such as benzyl and phenethyl; and modified forms of the above groups, such as alkyl groups which contain an oxygen atom, or in which a hydrogen atom attached to a carbon atom is replaced with a hydroxyl group or two hydrogen atoms are replaced with an oxygen atom to form a carbonyl group, as shown below.

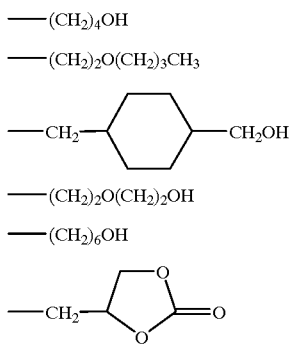

Exemplary tertiary alkyl groups having 4 to 20 carbon atoms represented by $R^{100}$ include tert-butyl, 1-methylcyclohexyl, 2-(2-methyl)adamantyl and tert-amyl.

Exemplary trialkylsilyl groups represented by $R^{100}$ whose alkyl groups each have 1 to 6 carbon atoms include trimethylsilyl, triethylsilyl and dimethyl-tert-butylsilyl. Examples of oxoalkyl groups having 4 to 20 carbon atoms represented by $R^{100}$ include 3-oxoalkyl groups and the groups of the following formulas.

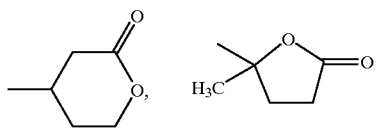

Illustrative examples of the acid labile groups having formula (11) above include straight and branched acetal groups such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetals such as tetrahydrofuranyl and tetrahydropyranyl. Of these, ethoxyethyl, butoxyethyl and ethoxypropyl are preferable. Illustrative examples of the acid labile groups having formula (12) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl. Examples of tertiary alkyl groups having 4 to 20 carbon atoms, trialkylsilyl groups whose alkyls each have 1 to 6 carbon atoms, and oxoalkyl groups having 4 to 20 carbon atoms which may serve as the acid labile group include the same groups as mentioned for $R^{100}$.

The above-described compound (dissolution regulator) in which phenolic hydroxyl groups are partially replaced with acid labile groups is blended in an amount of 0 to 50 parts, preferably 5 to 50 parts, and more preferably 10 to 30 parts, per 100 parts of the base resin, and may be used alone or as an admixture of two or more thereof. No improvement in resolution would be achieved with the addition of less than 5 parts, whereas the addition of more than 50 parts would result in pattern film loss and a low resolution.

As in the case of the base resin, the above-described dissolution regulator can be synthesized by chemically reacting acid labile groups with a compound having phenolic hydroxyl groups.

In place of or in addition to the above-described dissolution regulator, the resist materials of the invention may include as another dissolution regulator a compound having a weight-average molecular weight of more than 1,000 and up to 3,000, and containing phenolic hydroxyl groups on the molecule, wherein the hydrogen atoms on the phenolic hydroxyl groups are partially replaced, in an average proportion of 0 to 60% overall, with acid labile groups.

This compound in which some of the hydrogen atoms on the phenolic hydroxyl groups having been replaced with acid labile groups is preferably one or more compounds selected from among those having recurring units of general formula (13) below and having a weight-average molecular weight of more than 1,000 and up to 3,000.

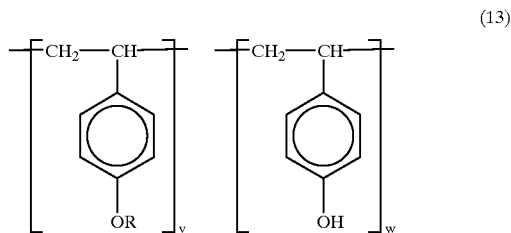

(13)

In the formula, R is an acid labile group, and the letters v and w are numbers which satisfy $0 \leq v/(v+w) \leq 0.6$.

Exemplary acid labile groups in the dissolution regulator include groups represented by above general formulas (11) and (12), tertiary alkyl groups having 4 to 20 carbon atoms, trialkylsilyl groups whose alkyl groups each have 1 to 6 carbon atoms, and oxoalkyl groups having 4 to 20 carbon atoms.

The amount of the other dissolution regulator blended is preferably such that the amount of the other dissolution regulator and the earlier-described dissolution regulator combined is 0 to 50 parts, more preferably 0 to 30 parts, and most preferably at least 1 part, per 100 parts of base resin.

As in the case of the base resin, the other dissolution regulator can be synthesized by chemically reacting acid labile groups with a compound having phenolic hydroxyl groups.

Adding a basic compound is known to improve both the stability of the resist following exposure and the resolution (see, for example, JP-A 232706/1993, JP-A 249683/1993, JP-A 158239/1993, JP-A 249662/1993, JP-A 257282/1993, JP-A 289322/1993 and JP-A 289340/1993). The addition of a basic compound is advantageous in the present invention as well. Nitrogenous compounds are familiar in the art as the basic compound, and include amine and amide compounds with melting points of at least 150° C.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n- butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (14) and (15) may also be blended.

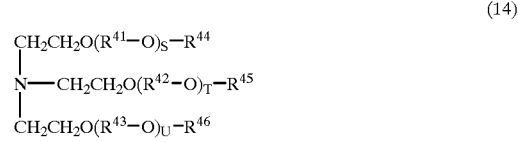

(14)

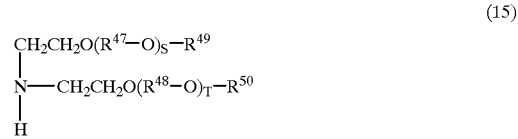

(15)

In the formulas, $R^{41}$, $R^{42}$, $R^{43}$, $R^{47}$ and $R^{48}$ are each independently straight, branched or cyclic alkylene of 1 to 20 carbon atoms; $R^{44}$, $R^{45}$, $R^{46}$, $R^{49}$ and $R^{50}$ are hydrogen, alkyl of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T and U are each integers from 0 to 20, preferably from 1 to 10, and more preferably from 1 to 8.

Illustrative examples of the compounds of formulas (14) and (15) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy) ethyl}amine, tris{2-(1-ethoxyethoxy)ethyl}amine, tris{2-(1-ethoxypropoxy)ethyl}amine, tris[2-{(2-hydroxyethoxy) ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy) ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably compounded in an amount of 0.01 to 10 parts, and especially 1 to 5 parts, per 100 parts of the above polymer.

An organic solvent is used in the resist material in the patterning method of the invention. This organic solvent may be any organic solvent in which the photoacid generator, base resin, dissolution regulator and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, diethylene glycol dimethyl ether, 1-ethoxy-2-propanol and ethyl lactate in which the photoacid generator serving as one of the resist components is most soluble, propylene glycol monomethyl ether acetate which is a safe solvent, and mixtures thereof are preferred.

The organic solvent may be used in any amount, although use in an amount such that the concentration of base polymer in the solution within this organic solvent is 5 to 50% by weight, and especially 10 to 30% by weight, is preferred.

Additives, such as UV absorbers for minimizing backscatter from the substrate, acetylene alcohol derivatives for improving shelf stability, and surfactants for better coating properties, may also be added to the resist material in the patterning method of the invention.

Compounds having a molar absorbance of not more than 10,000 at a wavelength of 248 nm may be blended as the UV absorber within the resist material used in the patterning method of the invention. This permits the resist material to be designed and controlled to a suitable transmittance for substrates of differing reflectances.

Illustrative examples of suitable UV absorbers include fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, naphthalene, pleiadene, picene, perylene, pentaphene, pentacene, benzophenanthrene, anthraquinone, anthrone, benzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and compounds having general formulas (16) and (17) below; fused heterocyclic derivatives such as thioxanthene-9-one, thianthrene and dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4,-bis(dimethylamino)benzophenone; and squaric acid derivatives such as squaric acid and dimethylsquarate.

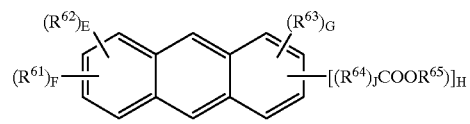

(16)

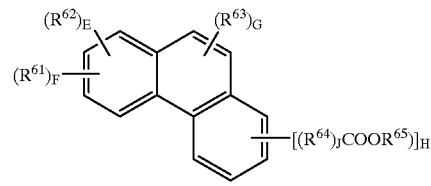

(17)

In the formulas, $R^{61}$ to $R^{63}$ are each independently hydrogen, straight or branched alkyl, straight or branched alkoxy, straight or branched alkoxyalkyl, straight or branched alkenyl, or aryl. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. Also, $R^{65}$ is an acid labile group; J is 0 or 1; E, F and G are each 0 or integers from 1 to 9; H is a positive integer from 1 to 10; and $E+F+G+H \leq 10$.

More specifically, in the foregoing formulas (16) and (17), $R^{61}$ to $R^{63}$ are each independently hydrogen, straight or branched alkyl groups, straight or branched alkoxy groups, straight or branched alkoxyalkyl groups, straight or branched alkenyl groups, or aryl groups. Exemplary straight or branched alkyl groups are those having 1 to 10 carbon atoms, such as methyl, ethyl, n-propyl, isopropyl, n-butyl, sec-butyl, tert-butyl, hexyl, cyclohexyl and adamantyl, of which methyl, ethyl, isopropyl and tert-butyl are preferred. Exemplary straight or branched alkoxy groups are those having 1 to 8 carbon atoms, such as methoxy, ethoxy, propoxy, isopropoxy, n-butoxy, sec-butoxy, tert-butoxy, hexyloxy and cyclohexyloxy, of which methoxy, ethoxy, isopropoxy and tert-butoxy are preferred. Exemplary straight or branched alkoxyalkyl groups are those having 2 to 10 carbon atoms, such as methoxymethyl, 1-ethoxypropyl, 1-propoxyethyl, and tert-butoxyethyl, of which methoxymethyl, 1-ethoxyethyl, 1-ethoxypropyl and 1-propoxyethyl are preferred. Exemplary straight or branched alkenyl groups are those having 2 to 4 carbons atoms, such as vinyl, propenyl, allyl, and butenyl. Exemplary aryl groups are those having 6 to 14 carbon atoms, such as phenyl, xylyl, toluyl, and cumenyl.

$R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom; and J in the formula is 0 or 1. When J is 0, the —$R^{64}$— linkage becomes a valence bond.

Exemplary substituted or unsubstituted divalent aliphatic hydrocarbon groups which may contain an oxygen atom are those having 1 to 10 carbon atoms, such as methylene, ethylene, n-propylene, isopropylene, n-butylene, sec-butylene, —$CH_2O$—, —$CH_2CH_2O$—, and —$CH_2OCH_2$—, of which methylene, ethylene, —$CH_2O$—, and —$CH_2CH_2O$— are preferable.

Examples of substituted or unsubstituted divalent alicyclic hydrocarbon groups which may contain an oxygen atom include those having 5 to 10 carbon atoms, such as 1,4-cyclohexylene, 2-oxacyclohexane-1,4-ylene, and 2-thiacyclohexane-1,4-ylene.

Examples of substituted or unsubstituted divalent aromatic hydrocarbon groups which may have an oxygen atom include those having 6 to 14 carbon atoms, such as o-phenylene, p-phenylene, 1,2-xylene-3,6-ylene, toluene-2, 5-ylene and 1-cumene-2,5-ylene; and allylalkylene groups having 6 to 14 carbon atoms such as —$CH_2Ph$—, —$CH_2PhCH_2$—, —$OCH_2Ph$—, and —$OCH_2PhCH_2O$— (wherein Ph is phenylene).

$R^{65}$ is an acid labile group, the term "acid labile group" used herein referring to a moiety in which a carboxyl group is substituted with one or more functional groups cleavable in the presence of an acid. This may be any moiety which cleaves in the presence of an acid to liberate an alkali-soluble functional group, although moieties having the following general formulas (18), (19) and (20) are especially preferred.

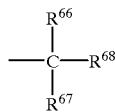

(18)

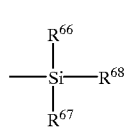

(19)

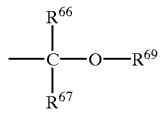

(20)

In the formulas, $R^{66}$ to $R^{69}$ are each independently hydrogen, straight or branched alkyl, straight or branched alkoxy, straight or branched alkoxyalkyl, straight or branched alkenyl, or aryl, any of which groups may have a carbonyl on the chain thereof, provided that $R^{66}$ to $R^{69}$ are not all hydrogen atoms. $R^{66}$ and $R^{67}$ may bond together to form a ring. $R^{69}$ is a straight or branched alkyl, straight or branched alkoxyalkyl, straight or branched alkenyl, or aryl, any of which may have a carbonyl on the chain thereof; and $R^{69}$ may bond with $R^{66}$ to form a ring.

These straight or branched alkyl, straight or branched alkoxy, straight or branched alkoxyalkyl, straight or branched alkenyl, and aryl groups may be illustrated by the same examples as given above for $R^{61}$ to $R^{63}$.

Examples of rings formed by the mutual bonding of $R^{66}$ and $R^{67}$ in formula (18) include those having 4 to 10 carbon atoms, such as cyclohexylidene, cyclopentylidene, 3-oxocyclohexylidene, 3-oxo-4-oxacyclohexylidene and 4-methylcyclohexylidene.

Examples of rings formed by the mutual bonding of $R^{66}$ and $R^{67}$ in formula (19) include those having 3 to 9 carbon atoms, such as 1-silacyclohexylidene, 1-silacyclopentylidene, 3-oxo-1-silacyclopentylidene, and 4-methyl-1-silacyclopentylidene.

Examples of rings formed by the mutual bonding of $R^{69}$ and $R^{66}$ in formula (20) include those having 4 to 10 carbon atoms, such as 2-oxacyclohexylidene, 2-oxacyclopentylidene, and 2-oxa-4-methylcyclohexylidene.

Exemplary groups represented by formula (18) include tertiary alkyl groups having 4 to 10 carbons, such as tert-amyl, 1,1-dimethylethyl, 1,1-dimethylbutyl, 1-ethyl-1-methylpropyl, and 1,1-diethylpropyl; and 3-oxoalkyl groups such as 1,1-dimethyl-2-oxobutyl, 3-oxocyclohexyl, and 1-methyl-3-oxo-4-oxacyclohexyl.

Preferred groups represented by formula (19) include trialkylsilyl groups having 3 to 10 carbon atoms, such as trimethylsilyl, ethyldimethylsilyl, dimethylpropylsilyl, diethylmethylsilyl, and triethylsilyl.

Preferred groups represented by formula (20) include groups having 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-isobutoxyethyl, 1-tert-pentoxyethyl, 1-cyclohexyloxyethyl, 1-(2'-n-butoxyethoxy) ethyl, 1-(2-ethylhexyloxy)ethyl, 1-{4-(acetoxymethyl) cyclohexylmethyloxy}ethyl, 1-{4-(tert-butoxycarbonyloxymethyl)cyclohexylmethyloxy}ethyl, 1-methoxy-1-methylethyl, 1-ethoxypropyl, dimethoxymethyl, diethoxymethyl, 2-tetrahydrofuranyl, and 2-tetrahydropyranyl.

In the above formulas (16) and (17), E, F and G are each 0 or positive integers from 1 to 9; H is a positive integer from 1 to 10; and $E+F+G+H \leq 10$.

Preferable examples of compounds represented by formulas (16) and (17) include the compounds shown in formulas (21a) to (21j) below.

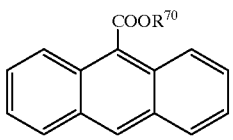

(21a)

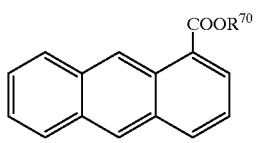

(21b)

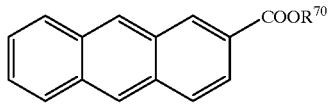
(21c)

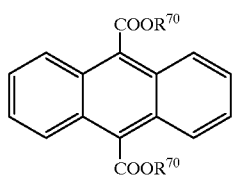
(21d)

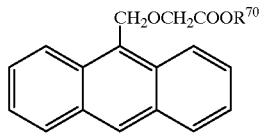
(21e)

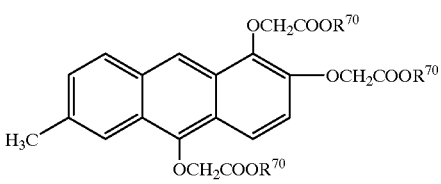
(21f)

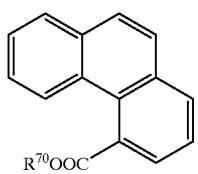
(21g)

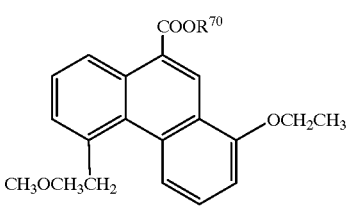
(21h)

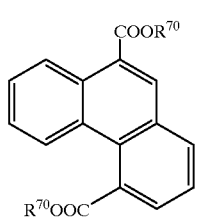
(21i)

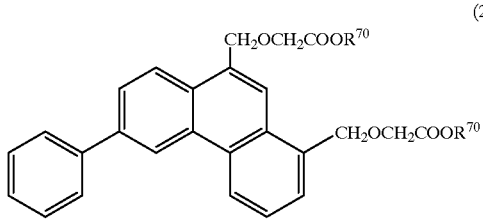
(21j)

In these formulas, $R^{70}$ is an acid labile group.

Examples of compounds which may be used as the UV absorber include also diarylsulfoxide derivatives such as bis(4-hydroxyphenyl)sulfoxide, bis(4-tert-butoxyphenyl)sulfoxide, bis(4-tert-butoxycarbonyloxyphenyl)sulfoxide, and bis[4-(1-ethoxyethoxy)phenyl]sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl] sulfone; diazo compounds such as benzoquinonediazide, naphthoquinonediazide, anthraquinonediazide, diazofluorene, diazotetralone and diazophenanthrone; and quinonediazide group-bearing compounds such as the complete or partial ester compounds of naphthoquinone-1,2-diazido-5-sulfonate chloride with 2,3,4-trihydroxybenzophenone, and the complete or partial ester compounds of naphthoquinone-1,2-diazido-4-sulfonate chloride with 2,4,4'-trihydroxybenzophenone.

Preferred examples of the UV absorber include tert-butyl 9-anthracenecarboxylate, tert-amyl 9-anthracenecarboxylate, tert-methoxymethyl 9-anthracenecarboxylate, tert-ethoxyethyl 9-anthracenecarboxylate, tert-tetrahydropyranyl 9-anthracenecarboxylate, tert-tetrahydrofuranyl 9-anthracenecarboxylate, and partial ester compounds of naphthoquinone-1,2-diazido-5-sulfonate chloride with 2,3,4-trihydroxybenzophenone.

The UV absorber serving as component is preferably blended within the resist material in an amount of 0 to 10 parts, more preferably 0.5 to 10 parts, and most preferably 1 to 5 parts, per 100 parts of the base resin.

In addition, an acetylene alcohol derivative may be included within the resist material in the patterning method of the invention for the purpose of enhancing the shelf stability.

Examples of compounds suitable for use as the acetylene alcohol derivative include those having general formulas (22) and (23) below.

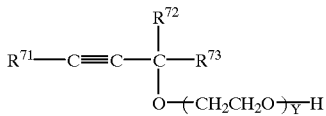
(22)

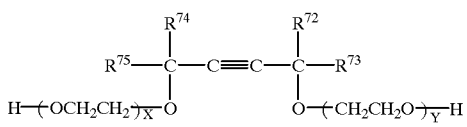
(23)

In the formulas, $R^{71}$, $R^{72}$, $R^{73}$, $R^{74}$ and $R^{75}$ are each hydrogen, or straight, branched or cyclic alkyl of 1 to 8 carbon atoms; and X and Y are 0 or positive integers which satisfy $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is added in an amount of 0.01 to 2%, and preferably 0.02 to 1% by weight, based on 100% by weight of the resist composition. Less than 0.01% by weight would be ineffective for improving the coating characteristics and shelf stability, whereas more than 2% by weight would result in a resist composition having a low resolution.

The resist material in the patterning method of the invention may also have included therein a surfactant which is commonly used for improving coating characteristics. The amount of surfactant added may be a conventional and effective amount so long as this does not compromise the objects of the invention.

Nonionic surfactants are preferred, examples of which include perfluoroalkylpolyoxyethylene ethanols, fluorinated alkyl esters, perfluoroalkylamine oxides, and fluorine-bearing organosiloxane compounds. Useful surfactants are commercially available under the trade names Florade FC-430 and FC-431 from Sumitomo 3M K.K., Surflon S-141 and S-145 from Asahi Glass K.K., Unidine DS-401, DS-403 and DS-451 from Daikin Industry K.K., Megafac F-8151 from Dai-Nippon Ink & Chemicals K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Pattern formation using the above-described chemically amplified positive resist material may be carried out by a known lithographic technique. For example, the resist material may be applied onto a silicon wafer by spin coating, and pre-baked at 80 to 150° C. for a period of 30 to 200 seconds, thereby forming a resist film having a thickness of 0.5 to 2.0 µm. The resist film may then be exposed to photo-energy radiation, such as deep-UV, electron-beam, or x-ray radiation, and baked at 70 to 140° C. for a period of from 30 to 200 seconds (post-exposure baking=PEB), after which development may be carried out with an aqueous alkali solution.

Of the various types of high-energy radiation that may be used, the resist material of the invention is best suited to fine pattern formation with, in particular, deep-UV light having a wavelength of 193 to 254 nm, electron-beam radiation, or x-ray radiation.

As mentioned above, the present invention uses a resist material which satisfies (E2−E1)/E2 in the relationship:

$$-0.2<(E2-E1)/E2<0.2.$$

This is the value obtained when a resist film is formed to a thickness of 0.3 to 3 µm, exposed, then baked at 110° C. for 90 seconds, and developed with an aqueous solution of 2.38 wt % tetramethylammonium hydroxide. The dissolution rates for various exposures can be determined using an instrument such as the Model 780 MKII dissolution rate-measuring device manufactured by Lithotech Japan.

EXAMPLE

Examples and comparative examples are given below to illustrate the invention, and are not intended to limit the scope thereof. In the examples, all parts are by weight.

Examples and Comparative Examples

Resist compositions were prepared by dissolving polyhydroxystyrenes (designated below as Polym. 1 to 12) in which some of the hydroxyl groups are protected with acid labile groups, photoacid generators (designated as PAG. 1 to 6), and dissolution regulators (designated as DRR. 1 to 4) in propylene glycol monomethyl ether acetate (PGMEA) or a solvent mixture of 70% by weight PGMEA and 30% by weight ethyl lactate (EL). These compositions were each filtered through a 0.2 µm Teflon filter, thereby giving resist solutions.

These resist solutions were spin-coated onto silicon wafers, then baked at 100° C. for 90 seconds on a hot plate to give resist films having a thickness of 0.7 µm.

The resist films were exposed using an excimer laser stepper (NSR-2005EX8A, from Nikon Corporation; NA 0.5). Immediately after exposure, the resist films were baked at 110° C. for 90 seconds, then developed for 60 seconds with a 2.38% solution of tetramethylammonium hydroxide in water, thereby giving positive patterns.

The resulting resist patterns were evaluated as described below. The results are shown in Tables 1 to 4.

Evaluation:

The resolution of a resist was defined as the minimum linewidth in the lines and spaces which separate at the optimum exposure dose (Eop), this being the exposure which provides a 1:1 resolution of 0.30 µm lines and spaces. The focus margins at the same exposure dose for 0.24 µm lines and spaces, isolated spaces at a pitch of 1.44 µm, and isolated remaining lines at a pitch of 1.44 µm were also determined.

The focus margins were determined under the following conditions.

(1) No missing space regions, and no foreign matter such as scum.
(2) No line-top film loss.
(3) Dimensions within a range of 0.21 to 0.27 µm.

The dimensions were measured using an S-7280 scanning electron microscope equipped with a micrometer, from Hitachi Ltd.

The solubility characteristics of the resist films were obtained by using a Model 780 MKII dissolution rate-measuring device from Lithotech Japan to determine the dissolution rates, at the respective exposures, on wafers on which resist had been coated, open frame-exposed, and post-exposure baked, then computing the value of (E2−E1)/E2.

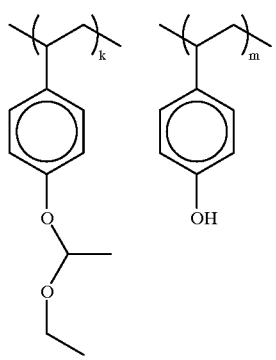
Polym.1 k:m = 36:64
Mw 10500
Mw/Mn 1.05
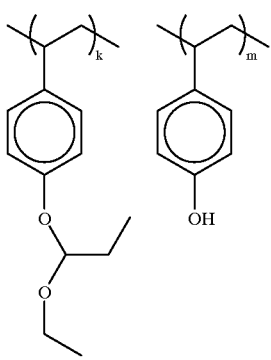
Polym.2 k:m = 32:68
Mw 10500
Mw/Mn 1.05
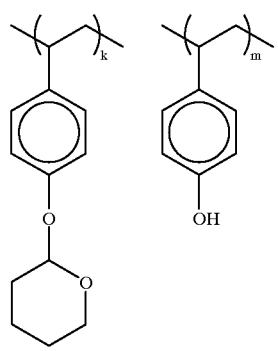
Polym.3 k:m = 32:68
Mw 10500
Mw/Mn 1.05
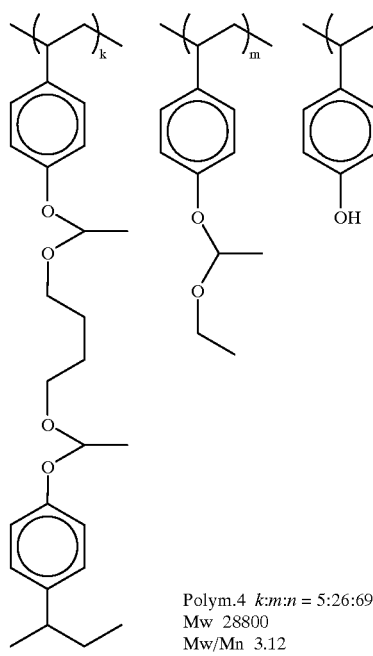
Polym.4 k:m:n = 5:26:69
Mw 28800
Mw/Mn 3.12
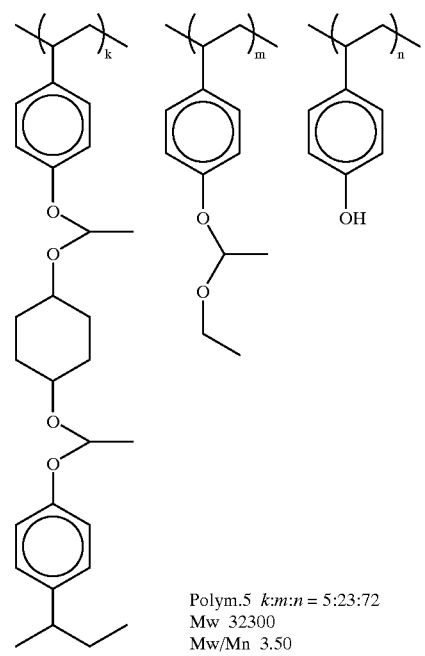
Polym.5 k:m:n = 5:23:72
Mw 32300
Mw/Mn 3.50

-continued
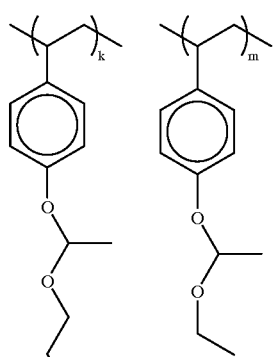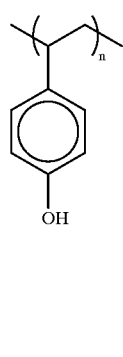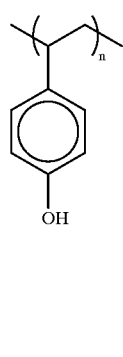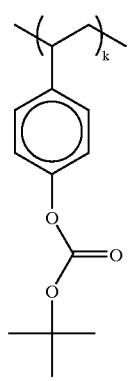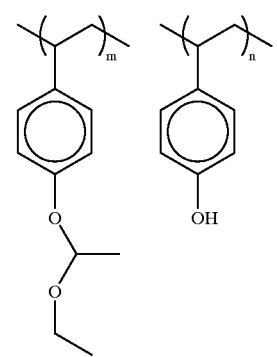
Polym.7 k:m:n = 3:30:67
Mw 10500
Mw/Mn 1.05
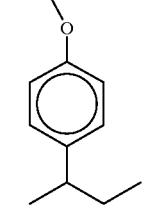
Polym.6 k:m:n = 5:27:68
Mw 25100
Mw/Mn 2.82
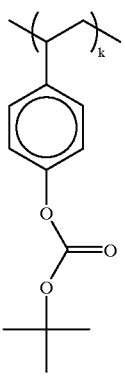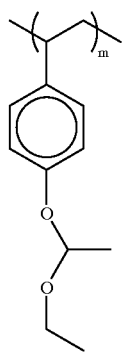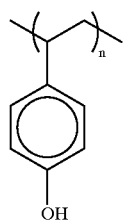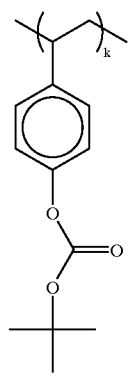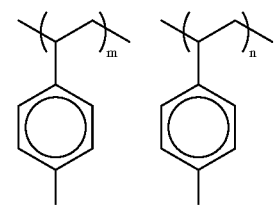
Polym.8 k:m:n = 8:24:68
Mw 10500
Mw/Mn 1.05
Polym.9 k:m:n = 18:10:72
Mw 10500
Mw/Mn 1.05
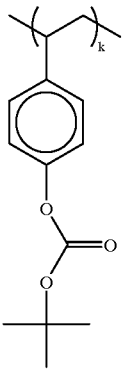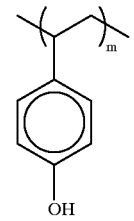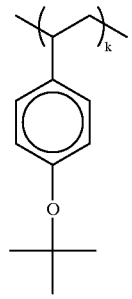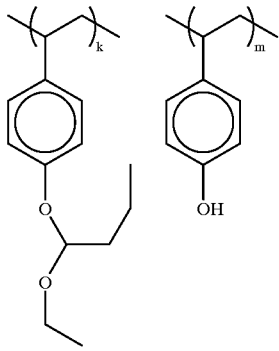
Polym.10 k:m = 26:74
Mw 10500
Mw/Mn 1.05
Polym.11 k:m = 29:71
Mw 10500
Mw/Mn 1.05
Polym.12 k:m = 28:72
Mw 10500
Mw/Mn 1.05

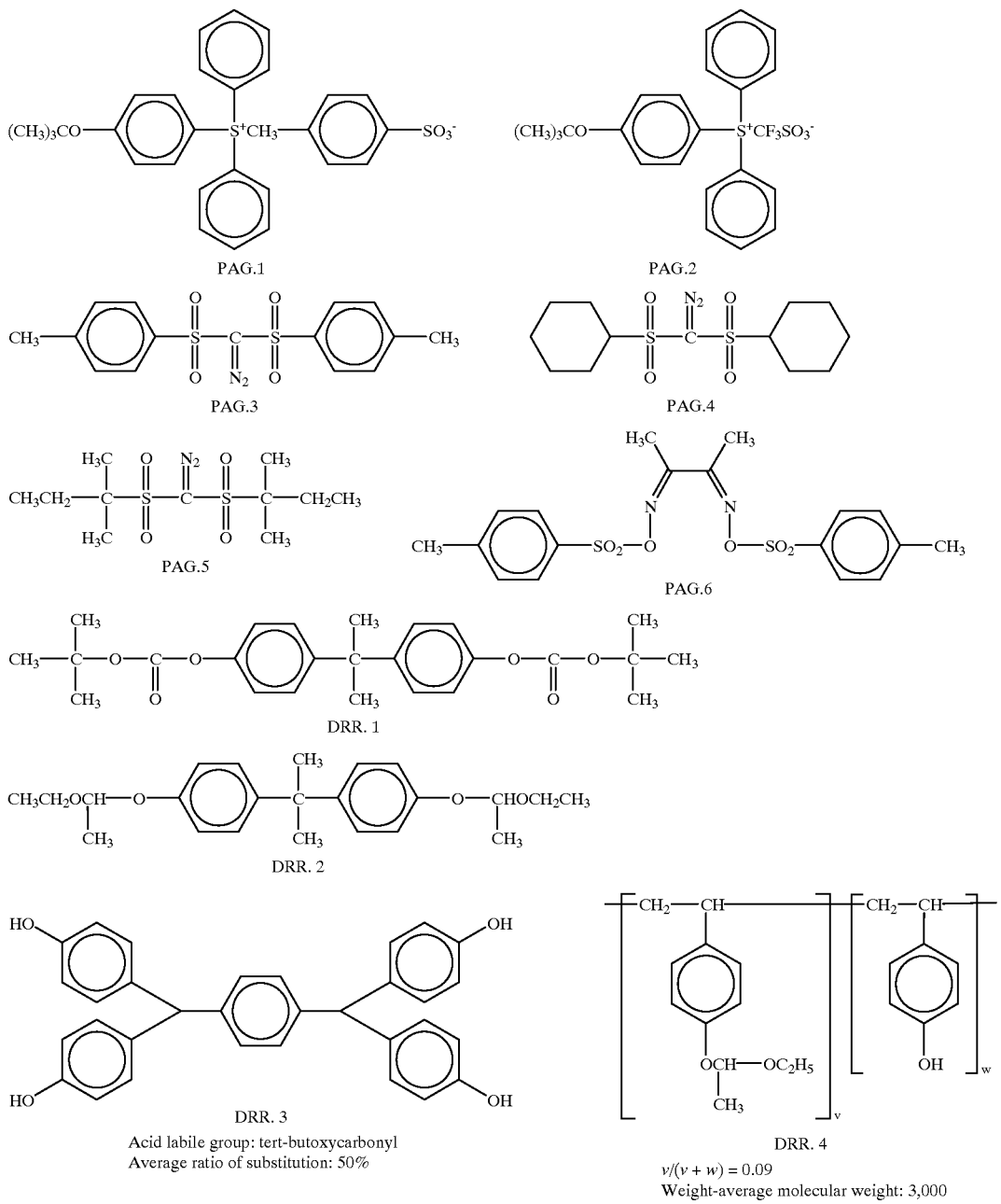
TABLE 1
| | Resist composition (proportions in parentheses are in parts by weight) | | | | | | | Focus margin (μm) | | | |
|---|---|---|---|---|---|---|---|---|---|---|---|
| | Alkali-soluble resin | | Photo-acid gener-ator | dissolu-tion regu-lator | Basic compound | Solvent | (E2-E1)/E2 | Reso-lution (μm) | 0.24 μm lines and spaces | 0.24 μm isolated lines | 0.24 μm spaces |
| | Struc-ture | Struc-ture | | | | | | | | | |
| Ex.1 | Polym.1 (60) | Polym.8 (20) | PAG.1 (4) | — | tributyl-amine (0.1) | PGMEA (300) | 0.1 | 0.20 | 1.4 | 1.2 | 1.0 |
| Ex.2 | Polym.1 (50) | Polym.9 (40) | PAG.1 (4) | — | tributyl-amine (0.1) | PGMEA (300) | 0.05 | 0.20 | 1.4 | 1.2 | 1.0 |

TABLE 1-continued

| | Resist composition (proportions in parentheses are in parts by weight) | | | | | | | Focus margin (μm) | | |
|---|---|---|---|---|---|---|---|---|---|---|
| | Alkali-soluble resin | | Photo-acid | dissolu-tion | | | (E2-E1)/ | Reso-lution | 0.24 μm lines and | 0.24 μm isolated | 0.24 μm |
| | Structure | Structure | generator | regulator | Basic compound | Solvent | E2 | (μm) | spaces | lines | spaces |
| Ex.3 | Polym.1 (40) | Polym.10 (40) | PAG.1 (4) | — | tributyl-amine (0.1) | PGMEA (300) | 0.05 | 0.20 | 1.2 | 1.2 | 1.0 |
| Ex.4 | Polym.2 (70) | Polym.8 (10) | PAG.1 (4) | — | tributyl-amine (0.1) | PGMEA (300) | 0.04 | 0.19 | 1.4 | 1.2 | 1.0 |
| Ex.5 | Polym.3 (80) | Polym.8 (80) | PAG.1 (4) | — | tributyl-amine (0.1) | PGMEA (300) | 0.1 | 0.22 | 1.2 | 1.2 | 0.8 |
| Ex.6 | Polym.4 (65) | Polym.8 (15) | PAG.1 (4) | — | tributyl-amine (0.1) | PGMEA (300) | 0.04 | 0.19 | 1.4 | 1.2 | 1.0 |
| Ex.7 | Polym.5 (70) | Polym.8 (10) | PAG.1 (4) | — | tributyl-amine (0.1) | PGMEA (300) | 0.04 | 0.19 | 1.4 | 1.2 | 1.0 |
| Ex.8 | Polym.6 (65) | Polym.8 (15) | PAG.1 (4) | — | tributyl-amine (0.1) | PGMEA (300) | 0.04 | 0.19 | 1.4 | 1.2 | 1.0 |
| Ex.9 | Polym.8 (80) | — | PAG.1 (4) | — | tributyl-amine (0.1) | PGMEA (300) | 0.05 | 0.20 | 1.2 | 1.2 | 1.0 |
| Ex.10 | Polym.8 (80) | — | PAG.2 (4) | — | tributyl-amine (0.1) | PGMEA (300) | 0.12 | 0.20 | 1.2 | 1.0 | 1.0 |
| Ex.11 | Polym.8 (80) | — | PAG.3 (4) | — | tributyl-amine (0.1) | PGMEA (300) | 0.02 | 0.20 | 1.2 | 1.2 | 1.0 |
| Ex.12 | Polym.8 (80) | — | PAG.1 (4) | DRR.1 (16) | tributyl-amine (0.1) | PGMEA (300) | 0.05 | 0.20 | 1.2 | 1.2 | 1.0 |
| Ex.13 | Polym.8 (80) | — | PAG.1 (4) | DRR.2 (16) | tributyl-amine (0.1) | PGMEA (300) | 0.05 | 0.20 | 1.2 | 1.2 | 1.2 |

TABLE 2

| | Resist composition (proportions in parentheses are in parts by weight) | | | | | | | Focus margin (μm) | | |
|---|---|---|---|---|---|---|---|---|---|---|
| | Alkali-soluble resin | | Photo-acid | dissolu-tion | | | (E2-E1)/ | Reso-lution | 0.24 μm lines and | 0.24 μm isolated | 0.24 μm |
| | Structure | Structure | generator | regulator | Basic compound | Solvent | E2 | (μm) | spaces | lines | spaces |
| Ex.14 | Polym.8 (80) | — | PAG.1 (4) | DRR.3 (16) | tributyl-amine (0.1) | PGMEA (300) | 0.05 | 0.20 | 1.2 | 1.2 | 1.2 |
| Ex.15 | Polym.8 (80) | — | PAG.1 (4) | DRR.4 (16) | tributyl-amine (0.1) | PGMEA (300) | 0.05 | 0.20 | 1.2 | 1.2 | 1.2 |
| Ex.16 | Polym.1 (60) | Polym.8 (20) | PAG.1 (4) | — | TMMEA (0.1) | PGMEA (300) | 0.1 | 0.20 | 1.4 | 1.2 | 1.0 |
| Ex.17 | Polym.1 (60) | Polym.8 (20) | PAG.1 (4) | — | TMEMEA (0.1) | PGMEA (300) | 0.1 | 0.20 | 1.4 | 1.2 | 1.0 |
| Ex.18 | Polym.1 (40) | Polym.8 (20) | PAG.1 (4) | — | tributyl-amine (0.1) | PGMEA/EL (300) | 0.1 | 0.20 | 1.4 | 1.2 | 1.0 |
| Ex.19 | Polym.1 (60) | Polym.8 (20) | PAG.4 (6) | — | tributyl-amine (0.1) | PGMEA (300) | 0.1 | 0.20 | 1.4 | 1.2 | 1.0 |
| Ex.20 | Polym.1 (60) | Polym.8 (20) | PAG.5 (4) | — | tributyl-amine (0.1) | PGMEA (300) | 0.1 | 0.20 | 1.2 | 1.2 | 0.8 |

TABLE 2-continued

| | Resist composition (proportions in parentheses are in parts by weight) | | | | | | | Focus margin (μm) | | |
|---|---|---|---|---|---|---|---|---|---|---|
| | Alkali-soluble resin | | Photo-acid | dissolu-tion | | | | | 0.24 μm lines | |
| | Struc-ture | Struc-ture | gener-ator | regu-lator | Basic compound | Solvent | (E2-E1)/E2 | Reso-lution (μm) | and spaces | isolated lines | 0.24 μm spaces |
| Ex.21 | Polym.1 (60) | Polym.8 (20) | PAG.6 (4) | — | tributyl-amine (0.1) | PGMEA (300) | 0.1 | 0.22 | 1.2 | 1.2 | 0.8 |

TMMEA: Tris{(2-methoxymethoxy)ethyl}amine
TMEMEA: Tris[2-{(2-methoxyethoxy)methoxy}ethyl]amine

TABLE 3

| | Resist composition (proportions in parentheses are in parts by weight) | | | | | | | | Focus margin (μm) | | |
|---|---|---|---|---|---|---|---|---|---|---|---|
| | Alkali-soluble resin | | Photo-acid | dissolu-tion | | | | | 0.24 μm lines | | |
| | Struc-ture | Struc-ture | gener-ator | regu-lator | Basic compound | Solvent | (E2-E1)/E2 | Reso-lution (μm) | and spaces | isolated lines | 0.24 μm spaces |
| CE 1 | Polym.1 (80) | — | PAG.1 (4) | — | tributyl-amine (0.1) | PGMEA (300) | 0.4 | 0.20 | 1.0 | 0.8 | 1.0 |
| CE 2 | Polym.1 (75) | Polym.8 (5) | PAG.1 (4) | — | tributyl-amine (0.1) | PGMEA (300) | 0.3 | 0.20 | 1.0 | 0.8 | 1.0 |
| CE 3 | Polym.1 (10) | Polym.8 (70) | PAG.1 (4) | — | tributyl-amine (0.1) | PGMEA (300) | −0.3 | 0.24 | 1.0 | 1.2 | 0.4 |
| CE 4 | Polym.2 (80) | — | PAG.1 (4) | — | tributyl-amine (0.1) | PGMEA (300) | 0.3 | 0.20 | 1.0 | 0.8 | 1.0 |
| CE 5 | Polym.3 (80) | — | PAG.1 (4) | — | tributyl-amine (0.1) | PGMEA (300) | 0.25 | 0.24 | 1.0 | 0.8 | 1.0 |
| CE 6 | Polym.4 (80) | — | PAG.1 (4) | — | tributyl-amine (0.1) | PGMEA (300) | 0.3 | 0.20 | 1.2 | 0.8 | 1.0 |
| CE 7 | Polym.5 (80) | — | PAG.1 (4) | — | tributyl-amine (0.1) | PGMEA (300) | 0.3 | 0.22 | 1.0 | 0.8 | 1.0 |
| CE 8 | Polym.6 (80) | — | PAG.1 (4) | — | tributyl-amine (0.1) | PGMEA (300) | 0.3 | 0.22 | 1.0 | 0.8 | 1.0 |
| CE 9 | Polym.7 (80) | — | PAG.1 (4) | — | tributyl-amine (0.1) | PGMEA (300) | 0.3 | 0.22 | 1.0 | 0.8 | 1.0 |
| CE 10 | Polym.9 (80) | — | PAG.1 (4) | — | tributyl-amine (0.1) | PGMEA (300) | −0.3 | 0.24 | 1.0 | 1.2 | 0.4 |
| CE 11 | Polym.10 (80) | — | PAG.1 (4) | — | tributyl-amine (0.1) | PGMEA (300) | −0.5 | 0.26 | 0.8 | 1.4 | 0.2 |
| CE 12 | Polym.11 (80) | — | PAG.1 (4) | — | tributyl-amine (0.1) | PGMEA (300) | −0.4 | 0.26 | 0.8 | 1.4 | 0.2 |
| CE 13 | Polym.12 (80) | — | PAG.1 (4) | — | tributyl-amine (0.1) | PGMEA (300) | −0.4 | 0.24 | 0.8 | 1.4 | 0.2 |

TABLE 4

| | Resist composition (proportions in parentheses are in parts by weight) | | | | | | | Focus margin (µm) | | | |
|---|---|---|---|---|---|---|---|---|---|---|---|
| | Alkali-soluble resin | | Photo-acid | dissolu-tion | | | (E2-E1)/ | Reso-lution | 0.24 µm lines and | 0.24 µm isolated | 0.24 µm |
| | Struc-ture | Struc-ture | gener-ator | regu-lator | Basic compound | Solvent | E2 | (µm) | spaces | lines | spaces |
| CE 14 | Polym.9 (80) | — | PAG.1 (4) | — | tributyl-amine (0.1) | PGMEA (300) | −0.3 | 0.24 | 1.0 | 1.2 | 0.4 |
| CE 15 | Polym.9 (80) | — | PAG.2 (4) | — | tributyl-amine (0.1) | PGMEA (300) | −0.28 | 0.22 | 1.0 | 1.2 | 0.6 |
| CE 16 | Polym.9 (80) | — | PAG.3 (4) | — | tributyl-amine (0.1) | PGMEA (300) | −0.25 | 0.24 | 1.0 | 1.2 | 0.4 |
| CE 17 | Polym.9 (80) | — | PAG.1 (4) | DRR.1 (16) | tributyl-amine (0.1) | PGMEA (300) | −0.28 | 0.24 | 1.2 | 1.2 | 0.4 |
| CE 18 | Polym.9 (80) | — | PAG.1 (4) | DRR.2 (16) | tributyl-amine (0.1) | PGMEA (300) | −0.28 | 0.24 | 1.0 | 1.2 | 0.4 |
| CE 19 | Polym.9 (80) | — | PAG.1 (4) | DDR.3 (16) | tributyl-amine (0.1) | PGMEA (300) | −0.28 | 0.24 | 1.0 | 1.2 | 0.4 |
| CE 20 | Polym.9 (80) | — | PAG.1 (4) | DRR.4 (16) | tributyl-amine (0.1) | PGMEA (300) | −0.28 | 0.24 | 1.0 | 1.2 | 0.4 |
| CE 21 | Polym.1 (80) | — | PAG.1 (4) | — | TMMEA (0.15) | PGMEA (300) | 0.4 | 0.20 | 1.0 | 0.8 | 1.0 |
| CE 22 | Polym.1 (80) | — | PAG.1 (4) | — | TMEMEA (0.2) | PGMEA (300) | 0.4 | 0.20 | 1.0 | 0.8 | 1.0 |
| CE 23 | Polym.1 (80) | — | PAG.1 (4) | — | tributyl-amine (0.1) | PGMEA/ EL (300) | 0.4 | 0.20 | 1.0 | 0.8 | 1.0 |
| CE 24 | Polym.1 (80) | — | PAG.4 (6) | — | tributyl-amine (0.1) | PGMEA (300) | 0.4 | 0.20 | 1.0 | 0.8 | 1.0 |
| CE 25 | Polym.1 (80) | — | PAG.5 (4) | — | tributyl-amine (0.1) | PGMEA (300) | 0.4 | 0.20 | 1.0 | 0.8 | 1.0 |
| CE 26 | Polym.1 (80) | — | PAG.6 (4) | — | tributyl-amine (0.1) | PGMEA (300) | 0.4 | 0.20 | 1.0 | 0.8 | 1.0 |

According to the present invention, there can be formed patterns of high resolution and focal depth.

What is claimed is:

1. A method for patterning a chemically amplified positive resist material comprising applying a resist material comprising a base polymer having acid labile groups which are eliminated by acid, a photoacid generator and an organic solvent, onto a substrate to a uniform thickness of at least 1500 Å so as to form a resist film which has dissolution rate properties giving the pattern formed therefrom high resolution and focal depth, and subsequently exposing, baking and then developing with a developer to form a positive pattern,
wherein the base polymer comprises a mixture of at least two base polymers having mutually differing acid labile groups or is a base polymer having at least two mutually differing acid labile groups on the same molecule and wherein the types of said mutually differing acid labile groups and their contents within the base polymer are such that, when said chemically amplified positive resist material is applied onto a substrate to a uniform thickness so as to form a resist film that is subsequently exposed, baked, then developed with a developer, an exposure E1 which results in an average dissolution rate of 100 Å/s for 500 Å from the surface of the resist film toward the substrate and an exposure E2 which results in an average dissolution rate of 100 Å/s for 1000 Å from the surface of the substrate toward the resist film surface satisfy the relationship:

$$-0.2 < (E2-E1)/E2 < 0.2.$$

2. The patterning method of claim 1 wherein the base polymer is polyhydroxystyrene or a copolymer of hydroxystyrene with styrene, α-methylstyrene, tert-butyl (meth) acrylate, maleic anhydride or di-tert-butyl maleate, in which some of the hydrogen atoms on the phenolic hydroxyl groups are substituted with acid labile groups.

3. The method of claim 2, wherein the content of hydroxystyrene units in the copolymers is 10–98 mol %.

4. The method of claim 2, wherein more than 0 and up to 80% of the phenolic hydroxyl groups of the polyhydroxystyrene or copolymer are substituted with acid labile groups.

5. The method of claim 2, wherein the polyhydroxystyrene or copolymer has a weight-average molecular weight of from 5,000 to 100,000.

6. The patterning method of claim 1 wherein the mutually differing acid labile groups are a combination of at least one acid labile group selected from Group 1 below with at least one acid labile group selected from Group 2 below:

Group 1

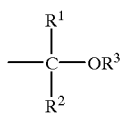
(1)

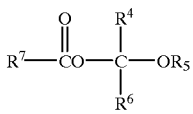
(2)

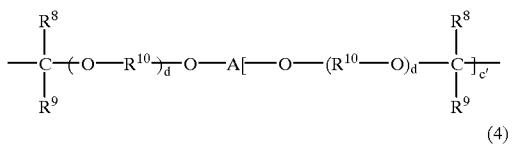
(3)

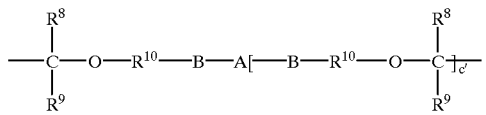
(4)

wherein $R^1$ and $R^2$ are hydrogen, methyl or ethyl; $R^3$ is a monovalent hydrocarbon of 1 to 18 carbon atoms which may contain a heteroatom; $R^1$ and $R^2$, $R^1$ and $R^3$ or $R^2$ and $R^3$ may together form a ring, with the proviso that when $R^1$ and $R^2$ form a ring, each is a straight or branched alkylene of 2 or 3 carbon atoms, and when $R^1$ and $R^3$ or $R^2$ and $R^3$ form a ring, each is a straight or branched alkylene of 2 to 18 carbon atoms; $R^4$, $R^5$ and $R^6$ are straight, branched or cyclic alkyl of 1 to 12 carbon atoms; $R^7$ is an alkylene of 1 to 8 carbon atoms; $R^8$ and $R^9$ are hydrogen or straight, branched or cyclic alkyl of 1 to 8 carbon atoms and may together form a ring, with the proviso that when they form a ring, each is a straight or branched alkylene of 1 to 8 carbon atoms; $R^{10}$ is a straight, branched or cyclic alkylene of 1 to 10 carbon atoms; the letter d is 0 or an integer from 1 to 10; A is a c-valent aliphatic or alicyclic saturated hydrocarbon, aromatic hydrocarbon or heterocyclic group having 1 to 50 carbon atoms which may have an intervening heteroatom, and in which some of the hydrogen atoms attached to the carbon atoms may be substituted with hydroxyl, carboxyl, acyl or fluorine; B is —CO—O—, —NHCO—O— or —NHCONH—; the letter c is an integer from 2 to 8; and c' is an integer from 1 to 7;

Group 2

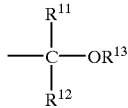
(5)

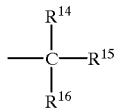
(6)

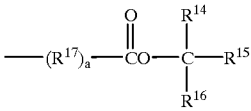
(7)

wherein $R^{11}$ and $R^{12}$ are hydrogen or straight, branched or cyclic alkyl of 3 to 12 carbon atoms, with the combined number of carbon atoms in $R^{11}$ and $R^{12}$ being 3 to 12; $R^{13}$ is a monovalent hydrocarbon having 1 to 18 carbon atoms which may contain a heteroatom; $R^{11}$ and $R^{12}$, $R^{11}$ and $R^{13}$ or $R^{12}$ and $R^{13}$ may together form a ring, with the proviso that when $R^{11}$ and $R^{12}$ form a ring, each is a straight or branched alkylene of 4 to 12 carbon atoms, and when $R^{11}$ and $R^{13}$ or $R^{12}$ and $R^{13}$ form a ring, each is a straight or branched alkylene of 4 to 18 carbon atoms; $R^{14}$, $R^{15}$ and $R^{16}$ are straight, branched or cyclic alkyl of 1 to 12 carbon atoms; $R^{17}$ is an alkylene of 1 to 8 carbon atoms; and the letter a is 0 or 1.

7. The method of claim 6, wherein the proportion of acid labile groups of Group 1 to acid labile groups of Group 2 is from 0.05 to 0.95.

8. The patterning method of claim 1 wherein the photoacid generator is at least one selected from among those having the general formula (8):

$$(R^+)_b M^+ K^- \qquad (8)$$

wherein $R^{30}$ is a straight, branched or cyclic alkyl of 1 to 12 carbon atoms, an aryl of 6 to 12 carbon atoms, or an aralkyl of 7 to 12 carbon atoms, $M^+$ is iodonium or sulfonium, $K^-$ is a non-nucleophilic counter-ion; and the letter b is 2 or 3, those having the general formula (9):

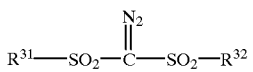
(9)

wherein $R^{31}$ and $R^{32}$ are straight, branched or cyclic alkyl or halogenated alkyl of 1 to 12 carbon atoms, aryl or halogenated aryl of 6 to 12 carbon atoms, or aralkyl of 7 to 12 carbon atoms, and those having the general formula (10):

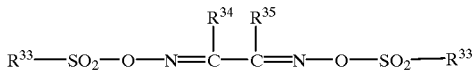
(10)

wherein $R^{33}$, $R^{34}$ and $R^{35}$ are straight, branched or cyclic alkyl or halogenated alkyl of 1 to 12 carbon atoms, aryl or halogenated aryl of 6 to 12 carbon atoms, or aralkyl of 7 to 12 carbon atoms, and $R^{34}$ and $R^{35}$, taken together, may form a cyclic structure, with the proviso that when they form a cyclic structure, each is a straight or branched alkylene of 1 to 6 carbon atoms, and is blended in an amount selected from within a range of 0.2 to 20 parts by weight per 100 parts by weight of the base polymer such as to satisfy the relationship:

$-0.2<(E2-E1)/E2<0.2$.

9. The method of claim 1, wherein E1 and E2 satisfy the relationship:

$-0.15<(E2-E1)/E2<0.15$.

10. The method of claim 1, wherein the photoacid generator is provided in an amount of 0.2 to 20 parts by weight per 100 parts by weight of the base polymer.

11. The method of claim 1, wherein the positive resist material further comprises a dissolution regulator.

12. The method of claim 1, wherein the positive resist material further comprises an amine or amide basic compound.

13. The method of claim 1, wherein the positive resist material is applied onto a silicon wafer substrate by spin coating, pre-baked at 80 to 150° C. for 30 to 200 seconds, exposed to photo-energy radiation, baked at 70 to 140° C. for 30 to 200 seconds and developed with an aqueous alkali solution.

14. The method of claim 1, wherein the resist film has a thickness of 0.5 to 2.0 $\mu$m.

15. The method of claim 1, wherein the resist film is exposed to deep UV light having a wavelength of 193 to 254 nm.

16. The method of claim 1, wherein the resist film is exposed to electron-beam radiation.

17. The method of claim 1, wherein the resist film is exposed to x-ray radiation.

* * * * *